United States Patent [19]
Sato et al.

[11] Patent Number: 5,607,866
[45] Date of Patent: Mar. 4, 1997

[54] METHOD OF FABRICATING A SEMICONDUCTOR DEVICE HAVING SILICIDE LAYERS FOR ELECTRODES

[75] Inventors: Kazushige Sato, Ome; Atsuo Watanabe, Hitachiota; Kenichi Kikushima; Nobuo Owada, both of Ome; Masaya Iida, Yokohama, all of Japan

[73] Assignee: Hitachi, Ltd., Tokyo, Japan

[21] Appl. No.: 458,112

[22] Filed: Jun. 2, 1995

[30] Foreign Application Priority Data

Jun. 10, 1994 [JP] Japan ................... 6-128923

[51] Int. Cl.$^6$ ................................ H01L 21/265
[52] U.S. Cl. ................ 437/31; 437/34; 437/59; 437/162; 437/200; 148/DIG. 9
[58] Field of Search ............... 437/34, 56, 59, 437/200, 31; 148/DIG. 9

[56] References Cited

U.S. PATENT DOCUMENTS

| | | | |
|---|---|---|---|
| 5,045,493 | 9/1991 | Kameyama et al. | 148/DIG. 9 |
| 5,075,241 | 12/1991 | Spratt et al. | 437/31 |
| 5,196,356 | 3/1993 | Won et al. | 437/31 |
| 5,441,903 | 8/1995 | Eklund | 437/59 |
| 5,455,189 | 10/1995 | Grubisich | 437/59 |

Primary Examiner—Tuan H. Nguyen
Attorney, Agent, or Firm—Antonellli, Terry, Stout & Kraus, LLP

[57] ABSTRACT

In a method of fabricating a semiconductor device having a MISFET and/or bipolar transistor and/or a resistor formed with different surface portions of a single silicon semiconductor substrate in which a silicide layer is formed on each of source/drain regions of the MISFET and/or collector contact region and extrinsic base region of the bipolar transistor and/or contact regions of the resistor, the bipolar transistor has its emitter region formed by diffusing an impurity contained in doped polysilicon film serving as an emitter electrode of the bipolar transistor into a part of its base region. The resistor may have a resistive region formed in a surface portion of the substrate and may be covered with an insulating film and a doped polysilicon film thereon or may have a doped polysilicon film formed over a surface portion of the substrate as a resistor element. These doped polysilicon films in the resistor are films which are formed in the same step as that for the doped silicon film serving as the emitter electrode in the bipolar transistor. Each of the doped polysilicon film in the bipolar transistor and that in the resistor are covered with an insulating film before a refractory metal film is formed over a whole surface of the substrate to prevent formation of silicide films on the doped polysilicon films in the bipolar transistor and resistor.

15 Claims, 16 Drawing Sheets

METHOD OF FABRICATING A SEMICONDUCTOR DEVICE HAVING SILICIDE LAYERS FOR ELECTRODES

BACKGROUND OF THE INVENTION

The present invention relates to semiconductor integrated circuit devices and more particularly to a technique which is effective for its application to a semiconductor integrated circuit device having at least two of a MISFET (metal insulator semiconductor field effect transistor), a bipolar transistor and a resistor.

With the circuit configuration highly integrated, the MOSFET (metal oxide semiconductor field effect transistor) included in a semiconductor integrated circuit device tends to be miniaturized. The tendency of the MOSFET to miniaturization urges a reduction in gate electrode length which leads to an increase in the wiring conductor resistance, shallow junctions of source/drain regions which leads to an increase in the source/drain resistance and small areas of the source/drain regions which leads to an increase in their contact resistances, thus preventing high-speed operation. Under the circumstances, with the aim of increasing the operation speed, a salicide (self aligned silicide) technique for formation of silicide layers on the upper surfaces of the gate electrode, source region and drain region has been employed. According to the salicide technique, a silicide layer is formed in a self-aligned fashion with a side wall spacer (insulating film) covering the side surface of the gate electrode of the MOSFET.

On the other hand, as a semiconductor integrated circuit device optimized for high integration, high speed and low power consumption, a semiconductor integrated circuit device having complementary MOSFET's (CMOS's) and an npn-type bipolar transistor has been developed. This type of semiconductor integrated circuit device uses the salicide technique with a view of further increasing the operation speed as described in, for example, IEDM, Technical Digest, 1987, pp.841–843. According to the salicide technique for the semiconductor integrated circuit device, the side surfaces of the gate electrodes of the complementary MOSFET's and the side surface of the emitter electrode of the npn-type bipolar transistor are covered with side wall spacers, a refractory metal film (for example, titanium film) is deposited on a whole surface of substrate including the upper surfaces of the gate electrode, source region, drain region, emitter electrode and extrinsic base region (base contact region) and thereafter the resulting structure is heat treated to form silicide layers on the upper surfaces of the gate electrode, source region, drain region, emitter electrode and extrinsic base region at a time.

JP-A-4-328833 (laid open on Nov. 17, 1992) discloses that in fabrication of a semiconductor integrated circuit device having a bipolar transistor, an emitter electrode is formed using a cap insulating film formed over the emitter electrode as a mask and an external base electrode is formed in a self-aligned fashion with the emitter electrode.

JP-A-63-244870 (laid open on Oct. 12, 1988) discloses that in fabrication of a semiconductor device having a MOS transistor and a bipolar transistor, a metal silicide layer is used for formation of specified one of electrodes of the transistor.

JP-A-3-48459 (laid open on Mar. 1, 1991) discloses that in fabrication of a semiconductor device having a MOS transistor and a bipolar transistor, side wall spacers for the MOS transistor and bipolar transistor are formed at a time.

SUMMARY OF THE INVENTION

The present inventors studied the semiconductor integrated circuit device using the aforementioned salicide technique to find the following problems.

(1) In the semiconductor integrated circuit device having complementary MOSFET's and an npn-type bipolar transistor, the emitter electrode of the npn-type bipolar transistor includes a polysilicon film into which an n-type impurity is introduced and a silicide layer formed on the upper surface of the polysilicon film by the salicide technique, with the aim of decreasing resistance of the emitter electrode and achieving diffusion of the impurity for formation of the emitter region. As described above, the silicide layer is formed by depositing a refractory metal film on a predetermined portion and thereafter heat treating the resulting substrate including the metal film. However, upon formation of the silicide layer, the n-type impurity introduced into the polysilicon film is absorbed by the silicide layer to increase the resistance of the emitter electrode. As a result, resistance (Re) of the emitter electrode of the npn-type bipolar transistor is increased, raising a problem that the operation speed of the semiconductor integrated circuit device is decreased.

The emitter region of the npn-type bipolar transistor, on the other hand, is formed by diffusing the n-type impurity which has been introduced into the emitter electrode, that is, the polysilicon film. However, when the thickness of the polysilicon film decreases as the miniaturization of the device prevails, the n-type impurity introduced into the polysilicon is absorbed by the silicide layer and consequently, upon formation of the emitter region, the diffusion amount of the n-type impurity is decreased and a shallow emitter region is formed (Gummel number is decreased). As a result, grounded emitter current amplification factor ($h_{FE}$) of the npn-type bipolar transistor is decreased, raising a problem that the operation speed of the semiconductor integrated circuit device is decreased.

Further, when the diffusion amount of the n-type impurity decreases as described above, lateral spread of the emitter region is decreased, with the result that the emitter electrode contacts the base region directly, causing short-circuit between the emitter electrode and base region.

(2) In the semiconductor integrated circuit device having a MOSFET and a resistor element, when the resistor includes a semiconductor region formed by introducing an impurity into the upper surface of the semiconductor substrate and when silicide layers are formed on the upper surfaces of the gate electrode and source and drain regions of the MOSFET by salicide technique, a silicide layer is also formed on the upper surface of the semiconductor region constituting the resistor. Accordingly, the impurity in the semiconductor region is absorbed by the silicide layer, which may cause the resistance of the resistor vary and electrical reliability of the semiconductor integrated circuit device may be degraded.

In the case where the resistor is formed of a polysilicon film into which an impurity is introduced, when silicide layers are formed on the upper surfaces of the gate electrode and source and drain regions of the MOSFET by salicide technique, a silicide layer is also formed on the upper surface of the polysilicon film. Accordingly, the impurity in the polysilicon film is absorbed by the silicide layer, raising problems that resistance of the resistor varies and electrical reliability of the semiconductor integrated circuit device is degraded.

Further, when the silicide layer is formed on the resistor as described above, the area occupied by the resistor in order to exhibit a desired resistance increases because sheet resistivity of the silicide layer is low. For example, the sheet resistivity of the silicide layer is several ohms/square and the sheet resistivity of the semiconductor region is several hundreds of ohms/square. Accordingly, the degree of integration of the semiconductor integrated circuit device is decreased.

An object of the present invention is to increase the operation speed of a semiconductor integrated circuit device having a MISFET and a bipolar transistor by decreasing resistance (Re) of the emitter electrode of the bipolar transistor.

Another object of the present invention is to increase the operation speed of a semiconductor integrated circuit device having a MISFET and a bipolar transistor by increasing the grounded emitter current amplification factor (hFE) of the bipolar transistor.

Still another object of the present invention is to increase electrical reliability and the degree of integration of a semiconductor integrated circuit device having a MISFET and a resistor by suppressing variations in resistance of the resistor and forming a miniature resistor.

According to one aspect of the present invention, for fabrication of a semiconductor device having a MISFET and/or bipolar transistor and/or a resistor formed with different surface portions of a single silicon semiconductor substrate in which a silicide layer is formed on each of source/drain regions of the MISFET and/or collector contact region and extrinsic base region of the bipolar transistor and/or contact regions of the resistor, the bipolar transistor has its emitter region formed by diffusing an impurity contained in doped polysilicon film serving as an emitter electrode of the bipolar transistor into a part of its base region.

According to another aspect of the present invention, the resistor may have a resistive region formed in a surface portion of the substrate and may be covered with an insulating film and a doped polysilicon film thereon or may have a doped polysilicon film formed over a surface portion of the substrate as a resistor element. These doped polysilicon films in the resistor are films which are formed in the same step as that for the doped silicon film serving as the emitter electrode in the bipolar transistor.

According to another aspect of the present invention, each of the doped polysilicon film in the bipolar transistor and that in the resistor are covered with an insulating film before a refractory metal film is formed over a whole surface of the substrate to prevent formation of silicide films on the doped polysilicon films in the bipolar transistor and resistor.

DESCRIPTION OF THE PREFERRED EMBODIMENTS

Figure 1:
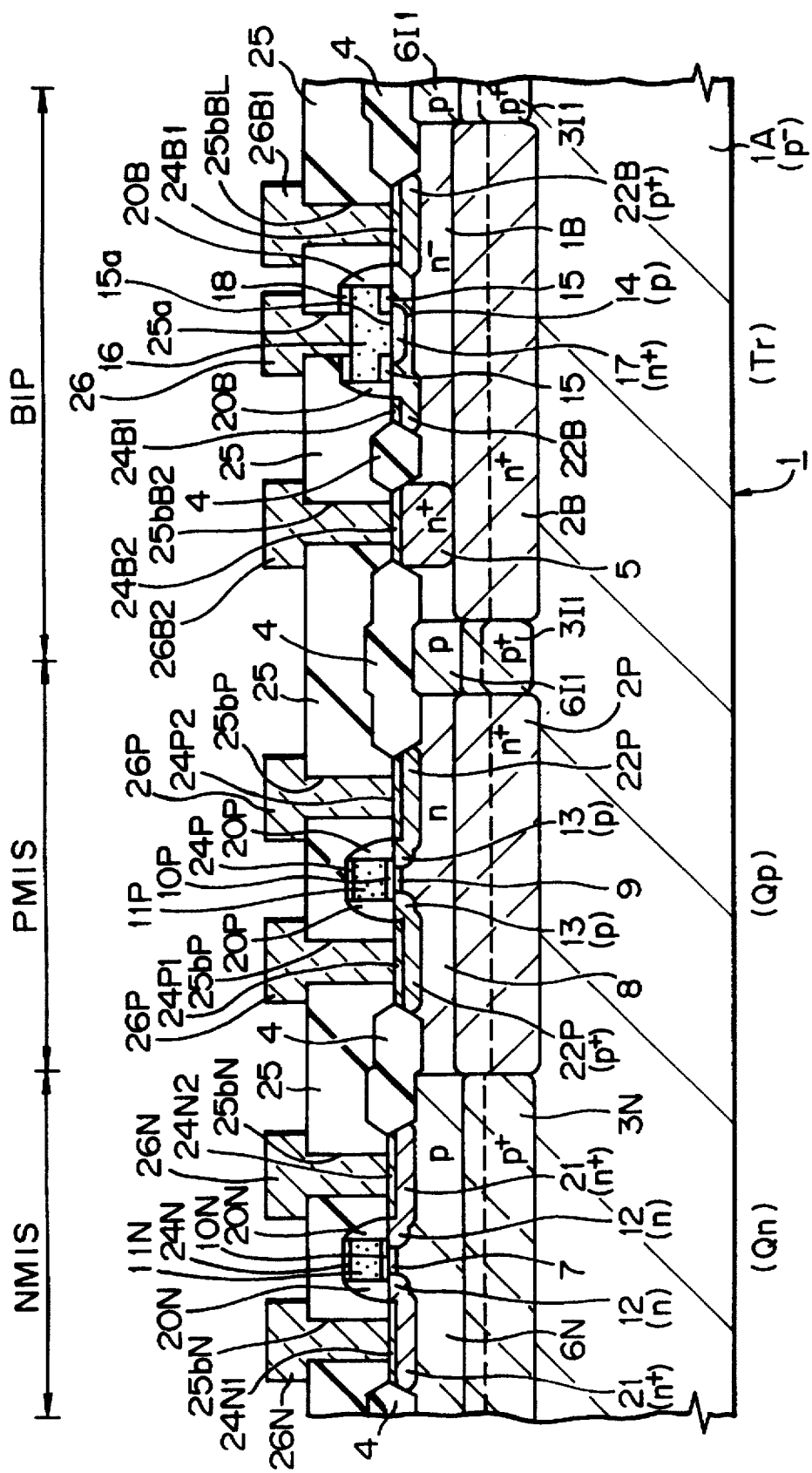
FIG. 1 is a fragmentary sectional view showing the schematic construction of a semiconductor integrated circuit device according to a first embodiment of the present invention.

The construction of the present invention will be described hereunder by way of example with reference to the accompanying drawings.

Throughout the drawings for explanation of embodiments, elements having the same function are designated by identical reference numerals and they will not be described repetitively.

(Embodiment 1)

Embodiment 1 is a first embodiment of the present invention in which the present invention is applied to a semiconductor integrated circuit device having an n-channel MISFET, a p-channel MISFET and an npn-type bipolar transistor.

The schematic construction of a semiconductor integrated circuit device according to the first embodiment of the present invention is shown in FIG. 1 (fragmentary sectional view).

As shown in FIG. 1, the semiconductor integrated circuit device of the present embodiment is formed using as main components a semiconductor base 1 which is obtained by growing an n-type epitaxial layer 1B on the upper surface of a p-type semiconductor substrate 1A made of single crystalline silicon through epitaxial growth process. The dotted line represents an interface between the semiconductor substrate 1A and the epitaxial layer 1B. For convenience of description, the semiconductor base 1 will also be simply referred to as a semiconductor substrate hereinafter. The substrate has a surface portion NMIS (active portion) at which an n-channel MISFET Qn is formed, a surface portion PMIS (active portion) at which a p-channel MISFET Qp is formed and a surface portion BIP (active portion) at which an npn-type bipolar transistor Tr is formed.

Formed in the surface portion NMIS of the semiconductor substrate 1 are a $p^+$-type buried semiconductor region (buried layers) 3N and a p-type well region 6N. Formed in the surface portion PMIS of the semiconductor substrate 1 are an $n^+$-type buried semiconductor region (buried layer) 2P and an n-type well region 8. Formed in the surface portion BIP of the semiconductor substrate 1 are an $n^+$-type buried semiconductor region (buried layer) 2B and a region of the n-type epitaxial layer 1B. The semiconductor substrate 1 also has surface portions serving as inactive portions in which a $p^+$-type buried semiconductor region 3I1 and p-type well region 6I1 are formed, respectively. The $p^+$-type buried semiconductor region 3I1 surrounds the periphery of the $n^+$-type buried semiconductor region 2B formed in the portion BIP and the p-type well region 6I1 surrounds the periphery of the n-type epitaxial layer 1B also formed in the portion BIP in order that the portion BIP is electrically insulated from the remaining active portions.

The n-channel MISFET Qn is formed at the upper surface of the p-type well region 6N having its periphery defined by a field insulating film 4. The n-channel MISFET Qn includes a threshold value voltage control layer 7, a gate insulating film 10N, a gate electrode 11N, a pair of n-type semiconductor regions 12 and a pair of $n^+$-type semiconductor regions 21, the paired regions 12 and paired regions 21 being cooperative to serve as source and drain regions. The threshold voltage control layer 7 is formed in the upper surface of the p-type well region 6N, the gate insulating film 10N is formed over the upper surface of the p-type well region 6N and the gate electrode 11N is formed on the gate insulating film 10N. The paired n-type semiconductor regions 12 are formed in the upper surface of the p-type well region 6N in a self-aligned fashion with the gate electrode 11N. The paired $n^+$-typetype semiconductor regions 21 are formed in the upper surface of the p-type well region 6N in a self-aligned fashion with a side wall spacer 20N covering the side surface of the gate electrode 11N. The $n^+$-typetype semiconductor region 21 is so set as to have a higher impurity concentration than the n-type semiconductor region 12. In other words, the n-channel MISFET Qn has a LDD (Lightly Doped Drain) structure.

The gate electrode 11N of the n-channel MISFET Qn includes a polysilicon film into which an n-type impurity for decreasing resistance is introduced and a silicide layer 24N formed on the polysilicon film. This silicide film 24N is formed in a self-aligned fashion with the side wall spacer 20N covering the side surface of the gate electrode 11N.

The p-channel MISFET Qp is formed at the upper surface of the n-type well region 8 having its periphery defined by the field insulating film 4. The p-channel MISFET Qp includes a threshold value voltage control layer 9, a gate insulating film 10P, a gate electrode 11P, a pair of p-type semiconductor regions 13 and a pair of $p^+$-type semiconductor regions 22, the paired regions 13 and paired regions 22P being co-operative to serve as source and drain regions. The threshold value voltage control layer 9 is formed in the upper surface of the n-type well region 8, the gate insulating film 10P is formed over the upper surface of the n-type well region 8 and the gate electrode 11P is formed on the gate insulating film 10P. The paired p-type semiconductor regions 13 are formed in the upper surface of the n-type well region 8 in a self-aligned fashion with the gate electrode 11P. The paired $n^+$-type semiconductor regions 22P are formed in the upper surface of the n-type well region 8 in a self-aligned fashion with a side wall spacer 20P covering the side surface of the gate electrode 11P. The $p^+$-type semiconductor region 22P is so set as to have a higher impurity concentration than the p-type semiconductor region 13. In other words, like the n-channel MISFET Qn, the p-channel MISFET Qp has a LDD structure.

The gate electrode 11P of the p-channel MISFET Qp includes a polysilicon film into which an n-type impurity is introduced and a silicide layer 24P formed on the polysilicon film. The silicide layer 24P is formed in a self-aligned fashion with the side wall spacer 20P covering the side surface of the gate electrode 11P.

The npn-type bipolar transistor Tr is formed at the upper surface of the n-type epitaxial layer 1B having its periphery defined by the field insulating film 4. The npn-type bipolar transistor Tr has a cascade structure in which an n-type emitter region, a p-type base region and an n-type collector region are arranged in sequence of this order in the direction of depth of the semiconductor substrate 1 from the upper surface thereof (the upper surface of the n-type epitaxial layer 1B).

The n-type collector region includes an intrinsic collector region, a high-concentration collector region and an $n^+$-type semiconductor region 5 for collector contact. The intrinsic collector region is formed of the n-type epitaxial layer 1B and the high-concentration collector region is formed of the $n^+$-type buried semiconductor region 2B. The $n^+$-type buried semiconductor region 2B is interposed between the p-type semiconductor substrate 1A and the n-type epitaxial layer 1B. The $n^+$-type semiconductor region 5 for collector contact is formed in the n-type epitaxial layer 1B. The bottom of the $n^+$-type semiconductor region 5 contacts the $n^+$-type semiconductor region 2B serving as the high-concentration collector region.

The p-type base region includes an intrinsic base region and an extrinsic base region (base contact region). The intrinsic base region is formed of a p-type semiconductor region 14 formed in the upper surface of the n-type epitaxial layer 1B. The extrinsic base region is formed of a $p^+$-type semiconductor region 22B formed in the n-type epitaxial layer 1B. This $p^+$-type semiconductor region 22B surrounds the p-type semiconductor region 14 and comes into contact therewith. The $p^+$-type semiconductor region 22B is so set as to have a higher impurity concentration than the p-type semiconductor region 14.

The emitter region is formed of an $n^+$-type semiconductor region 17 formed in the upper surface of the p-type semiconductor region 14 serving as the intrinsic base region. Am emitter electrode 16 is electrically connected to this $n^+$-type semiconductor region 17 through an emitter opening 15a formed in an insulating film 15.

The upper surface of the emitter electrode 16 is covered with an insulating film 18. With the aim of decreasing resistance and diffusing an impurity for formation of the emitter region, the emitter electrode 16 is formed of a polysilicon film into which an n-type impurity is introduced. In other words, the $n^+$-type semiconductor region 17 serving as the emitter region is formed by diffusing the n-type impurity which has been introduced into the emitter electrode 16 into the p-type semiconductor region 14 serving as the intrinsic base region.

A wiring conductor 26 is electrically connected to the emitter electrode 16 through a connection hole 25a formed in the insulating film 18 and an inter-layer insulating film 25. Since the upper surface of the emitter electrode 16 is covered with the insulating film 18, any silicide layer is not formed on the upper surface of the emitter electrode in a step for formation of silicide layer.

With the aim of decreasing contact resistance and base resistance, a silicide layer 24B1 is formed on the upper surface of the $p^+$-type semiconductor region 22B serving as the extrinsic base region. The silicide layer 24B1 is formed in a self-aligned fashion with a side wall spacer 20B covering the side surface of the emitter electrode 16. A wiring conductor 26B1 is electrically connected to this silicide layer 24B1 through a connection hole 25bB1 formed in the inter-layer insulating film 25.

With the aim of decreasing contact resistance, a silicide layer 24B2 is formed on the upper surface of the n$^+$-type semiconductor region 5 for collector contact. This silicide layer 24B2 is formed in a self-aligned fashion with the field insulating film 4. A wiring conductor 26B2 is electrically connected to the silicide layer 24B2 through a connection hole 25bB2 formed in the inter-layer insulating film 25.

In the n-channel MISFET Qn, with the aim of decreasing contact resistance, silicide layers 24N1 and 24N2 are formed on the upper surfaces of the paired n$^+$-type semiconductor regions 21, respectively, the regions 21 serving as the source and drain regions. Each of the silicide layers 24N1 and 24N2 is formed in a self-aligned fashion with the side wall spacer 20N covering the side surface of the gate electrode 11N. A wiring conductor 26N is electrically connected to each of the silicide layers 24N1 and 24N2 through a connection hole 25bN formed in the inter-layer insulating film 25.

In the p-channel MISFET Qp, with the aim of decreasing contact resistance, silicide layers 24P1 and 24P2 are formed on the upper surfaces of the paired p$^+$-type semiconductor regions 22P, respectively, the regions 22P serving as the source and drain regions. Each of the silicide layers 24P1 and 24P2 is formed in a self-aligned fashion with the side wall spacer 20P covering the side surface of the gate electrode 11P. A wiring conductor 26P is electrically connected to each of the silicide layers 24P1 and 24P2 through a connection hole 25bP formed in the inter-layer film 25.

By forming the silicide layers 24N and 24P on the upper surfaces of the gate electrodes 11N and 11P of n-channel MISFET Qn and p-channel MISFET Qp, respectively, in this manner, gate resistance of the gate electrodes can be decreased and hence the operation speed of the semiconductor integrated circuit device can be increased.

Further, by forming the silicide layers 24N1 and 24N2, 24P1 and 24P2, and 24B1 on the upper surfaces of the paired n$^+$-type semiconductor regions 21 serving as the source and drain regions of the n-channel MISFET Qn, on the upper surfaces of the paired p$^+$-type semiconductor regions 22P serving as the source and drain regions of the p-channel MISFET Qp and on the upper surface of the p$^+$-type semiconductor region 22B serving as the extrinsic base region of the npn-type bipolar transistor Tr, respectively, contact resistance can be decreased and hence the operation speed of the semiconductor integrated circuit device can be increased.

A method for fabrication of the semiconductor integrated circuit device set forth above will now be described with reference to FIGS. 2 to 12 (fragmentary sectional views illustrative of individual fabrication steps).

Firstly, a p-type semiconductor substrate 1A made of single crystalline silicon is prepared. The p-type semiconductor substrate 1A has a resistivity of, for example, about 10 [Ωcm].

Figure 2:
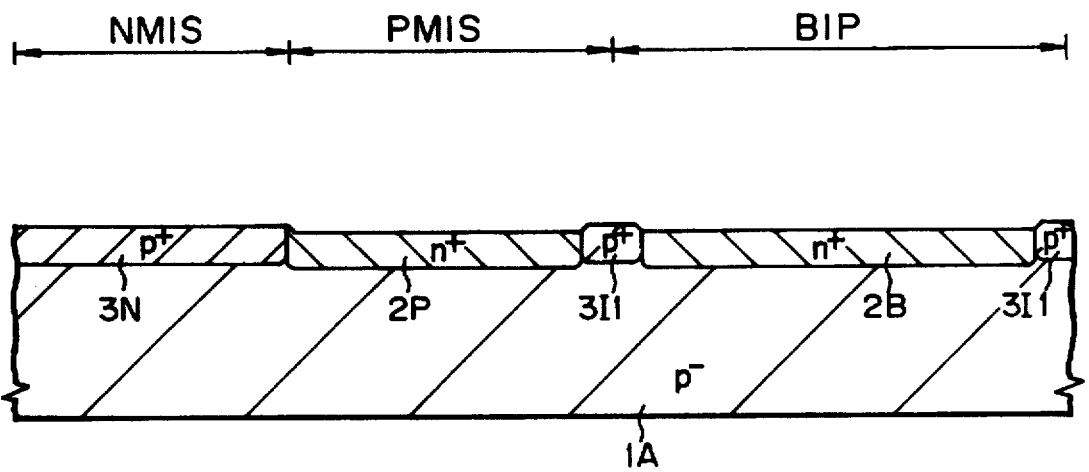
FIGS. 2 to 12 are fragmentary sectional views useful to explain a method for fabrication of the semiconductor integrated circuit device shown in FIG. 1.

Next, an n-type impurity and a p-type impurity are selectively introduced into different surface portions NMIS, PMIS and BIP of the p-type semiconductor substrate 1A to form, as shown in FIG. 2, a p$^+$-type semiconductor region 3N in the surface portion NMIS of the substrate 1A, an n$^+$-type semiconductor region 2P in the surface portion PMIS of the substrate 1A and an n$^+$-type semiconductor region 2B and p$^+$-type semiconductor region 3I in the surface portion BIP of the substrate 1A, the region 3I serving as an inactive region.

Figure 3:
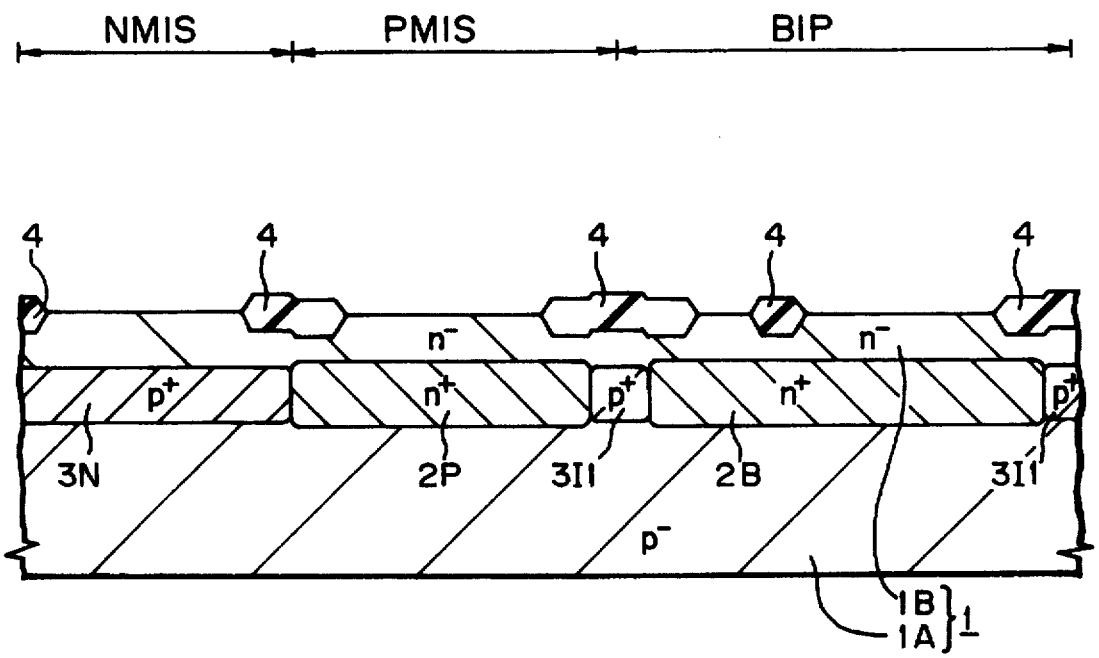

Next, as shown in FIG. 3, an n-type epitaxial layer 1B is caused to grow on the upper surface of the p-type semiconductor substrate 1A through epitaxial growth method. Thanks to growth of the n-type epitaxial layer 1B, there results formation of a p$^+$-type buried semiconductor region 3N and n$^+$-type buried semiconductor regions 2P and 2B. Upon formation of the layer 1B, diffusion of a p-type impurity of the p$^+$-type semiconductor region 3N into the n-type epitaxial layer 1B takes place and diffusion of an n-type impurity of the n$^+$-type semiconductor region 2P into the n-type epitaxial layer 1B takes place. Also, a semiconductor base (substrate) 1 is completed in which the n-type epitaxial layer 1B is grown on the upper surface of the p-type semiconductor substrate 1A.

Next, a well-known selective oxidizing method is used to form, on the upper surface of the resulting semiconductor substrate (n-type epitaxial layer 1B) 1, a field insulating film 4 which defines peripheries of the portions NMIS, PMIS and BIP, as shown in FIG. 3. The field insulating film 4 has a thickness of, for example, about 300 to 500 [nm].

Figure 4:
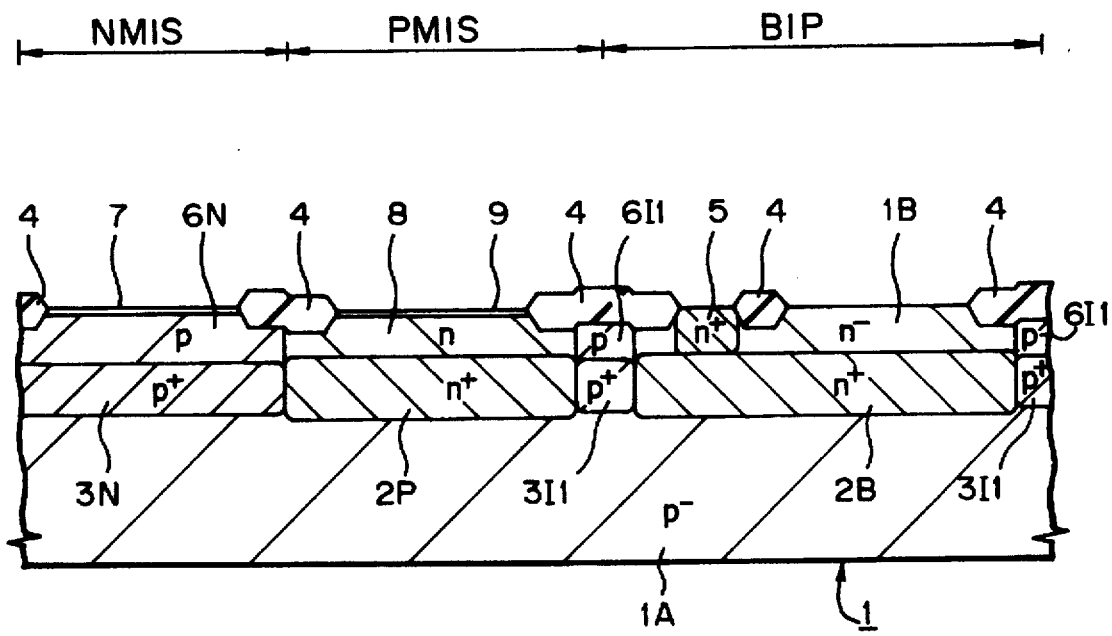

Next, as shown in FIG. 4, an n-type impurity is selectively introduced into a part of the portion BIP of the semiconductor substrate 1 to form an n$^+$-type semiconductor region 5 for collector contact.

Next, an n-type impurity (for example, P) is selectively introduced into the portion PMIS of the semiconductor substrate 1 through ion implantation process to form an n-type well region 8.

Next, as shown in FIG. 4, a p-type impurity (for example, B or BF$_2$) is selectively introduced into the upper surfaces of the portion NMIS and inactive portions of the semiconductor substrate 1 through ion implantation process to form p-type well regions 6N and 6I1 in the epitaxial layer 1B in the portion NMIS and in the inactive portion, respectively. The p-type impurity is given, for the selective introduction, energy sufficient to pass through the field insulating film 4. Thereafter, as shown in FIG. 4, a threshold value voltage control layer 9 is selectively formed on the upper surface of the n-type well region 8 and at the portion NMIS of the semiconductor substrate 1, a threshold value voltage control layer 7 is selectively formed on the upper surface of the p-type well region 6N. The n-type impurity for forming the n-type well region 8 may also be introduced into the upper surface of the portion BIP of the semiconductor substrate 1.

Figure 5:
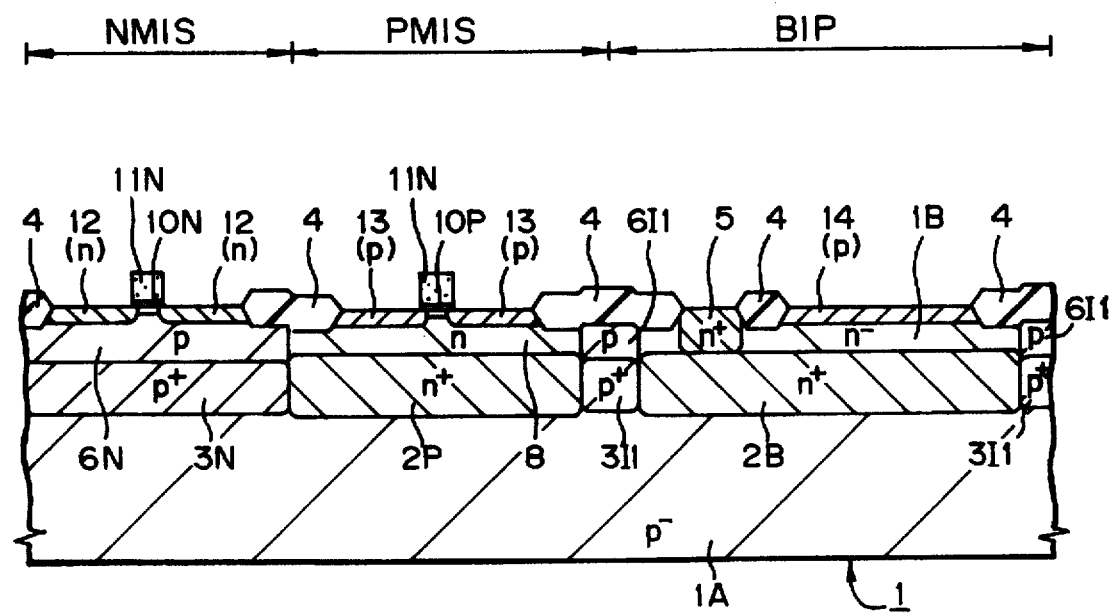

Next, as shown in FIG. 5, the resulting substrate 1 is heat treated to form a gate insulating film 10N, formed of a silicon oxide film, on a part of the upper surface of the p-type well region 6N and a gate insulating film 10P, also formed of a silicon oxide film, on a part of the upper surface of the n-type well region 8. Each of the gate insulating films 10N and 10P has a thickness of, for example, about 9 [nm].

Next, a polysilicon film is deposited on a whole surface of semiconductor substrate 1 including the gate insulating films 10N and 10P through, for example, CVD process. The polysilicon film has a thickness of, for example, about 300 [nm]. An impurity for decreasing resistance is introduced into this polysilicon film during or after the deposition.

Next, the polysilicon film is patterned to form a gate electrode 11N on the gate insulating film 10N over the p-type well region 6N and a gate electrode 11P on the gate insulating film 10P over the n-type well region 8.

Next, an n-type impurity (for example, P or As) is selectively introduced into the upper surface of the p-type well region 6N through ion implantation process to form a pair of n-type semiconductor regions 12 serving as source and drain regions. Each of the paired n-type semiconductor regions 12 is formed in a self-aligned fashion with the gate electrode 11N and field insulating film 4.

Next, a p-type impurity (for example, B or BF$_2$) is selectively introduced into the upper surface of the n-type well region 8 through ion implantation process to form a pair of p-type semiconductor regions 13 serving as source and drain regions. Each of the paired p-type semiconductor regions 13 is formed in a self-aligned fashion with the gate electrode 11P and field insulating film 4.

Next, a p-type impurity (for example, B or BF$_2$) is selectively introduced into the upper surface of the portion BIP of the semiconductor substrate 1 through ion implantation process to form, as shown in FIG. 5, a p-type semiconductor region 14 serving as an intrinsic base region.

Figure 6:
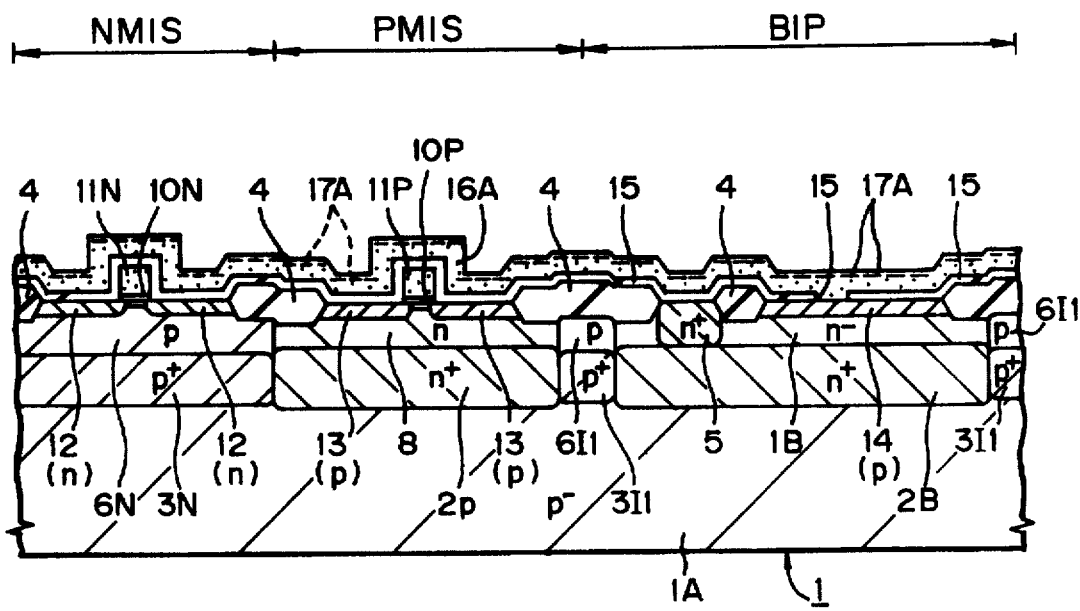

Next, as shown in FIG. 6, an insulating film (15) is formed on a whole surface of the semiconductor substrate 1. The insulating film (15) is formed of a silicon oxide film deposited through, for example, CVD process. Thereafter, as shown in FIG. 6, an emitter opening 15a which exposes a part of the upper surface of the p-type semiconductor region 14 is formed in the insulating film (15).

Next, a polysilicon film 16A is deposited through, for example, CVD process on a part of p-type semiconductor region 14 exposed through the emitter opening 15a and on a whole surface of the insulating film 15. This polysilicon film 16A has a thickness of, for example, about 100 to 200 [nm].

Next, as shown in FIG. 6, an n-type impurity (for example, As) is introduced into the upper surface of the polysilicon film 16A through ion implantation process to make the polysilicon film 16A an n-type film. The n-type impurity 17A is introduced for the purpose of decreasing the resistance of the polysilicon film 16A and forming an impurity diffusion source for later formation of the emitter region.

Figure 7:
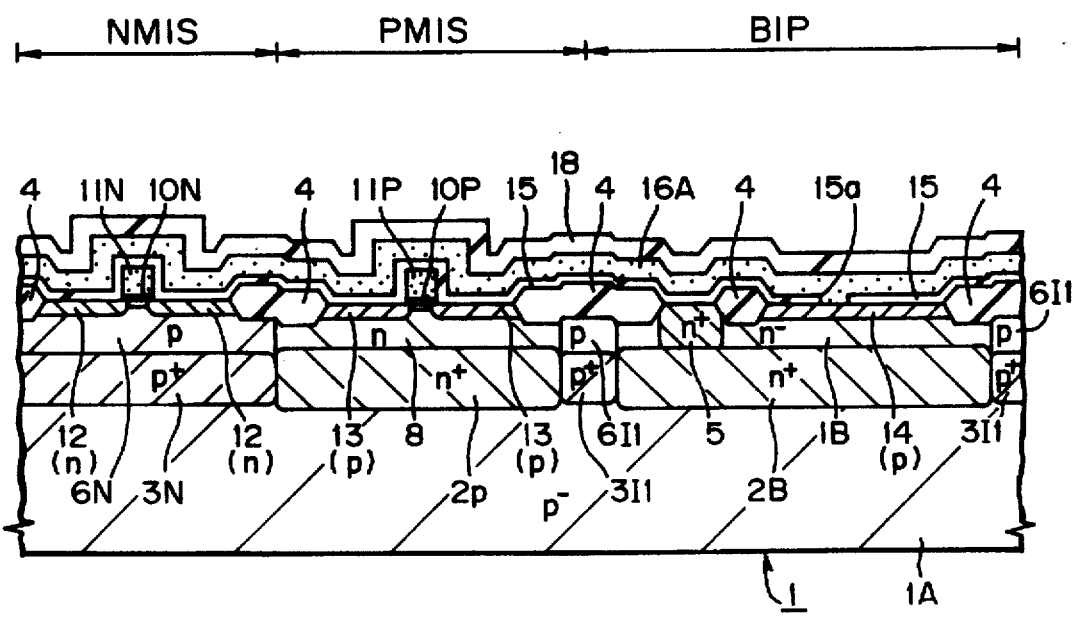

Next, as shown in FIG. 7, an insulating film 18 is formed on a whole surface of the polysilicon film 16A. The insulating film 18 is formed of a silicon oxide film deposited through, for example, CVD process and has a thickness of, for example, about 100 to 200 [nm].

Figure 8:
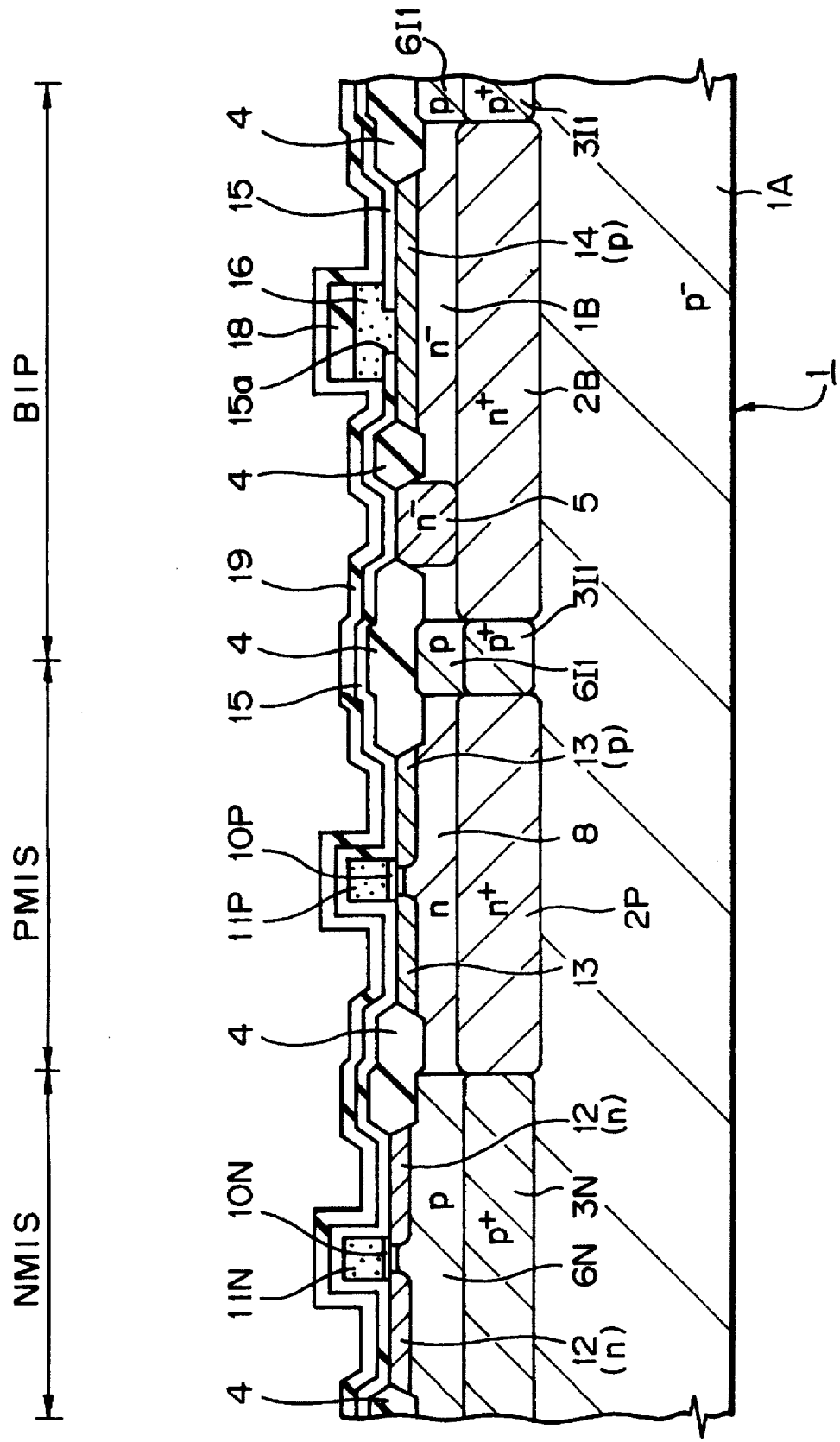

Next, as shown in FIG. 8, the insulating film 18 and polysilicon film 16A are patterned sequentially to form an emitter electrode 16 having its surface covered with the insulating film 18. In this step, the insulating film 15 is kept to remain.

Next, as shown in FIG. 8, an insulating film 19 is formed on a whole surface including the upper surface of the insulating film 18, the side surface of the emitter electrode 16 and a part of the upper surface of insulating film 15 which has been exposed as a result of the patterning. The insulating film 19 is formed of a silicon oxide film deposited through, for example, CVD process and has a thickness of, for example, about 100 [nm].

Figure 9:
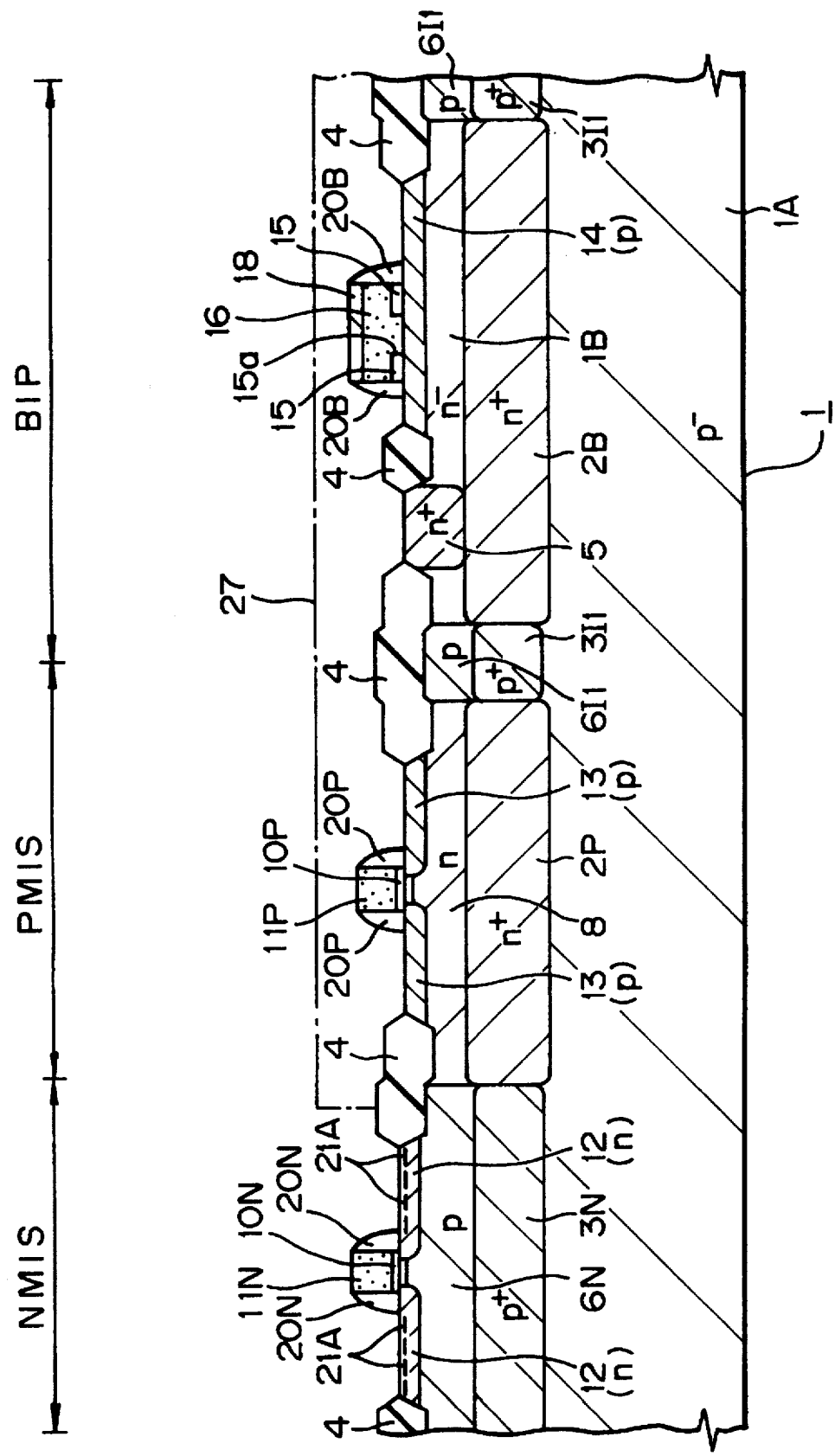

Next, as shown in FIG. 9, each of the insulating films 19 and 15 undergoes anisotropic etching such as RIE (reactive ion etching) to form a side wall spacer 20N covering the side surface of the gate electrode 11N, a side wall spacer 20P covering the side surface of the gate electrode 20P and a side wall spacer 20B covering the side surface of the emitter electrode 16. Through this step, silicon on the upper surfaces of the n$^+$-type semiconductor region 5, n-type semiconductor regions 12, p-type semiconductor regions 13 and 14 and gate electrodes 11N and 11P is exposed. In this step, the insulating film 18 covering the upper surface of the emitter electrode 16 is slightly etched to decrease its thickness. After completion of this step, the whole surface of the emitter electrode 16 is covered with the insulating film 18 and side wall spacer 20B.

Next, the resulting structure is subjected to a thermal oxidation treatment to form a protective film (not shown) in the form of a thin silicon oxide film on the upper surfaces of the n-type semiconductor regions 12 and p-type semiconductor regions 13 and 14. The protective film serves to prevent the substrate from being damaged or contaminated when an impurity is introduced into the substrate.

Next, a mask 27 is formed which covers the upper surfaces of the portions PMIS and BIP of the semiconductor substrate 1. The mask 27 is formed of, for example, a photoresist film.

Next, as shown in FIG. 9, by using the mask 27 as a mask for introduction of impurity, an n-type impurity (for example, As) 21A is selectively introduced into the upper surfaces of the n-type semiconductor regions 12, having their contour defined by the field insulating film 4, gate electrode 11N and side wall spacer, through ion implantation process. Thereafter, the mask 27 is removed.

Figure 10:
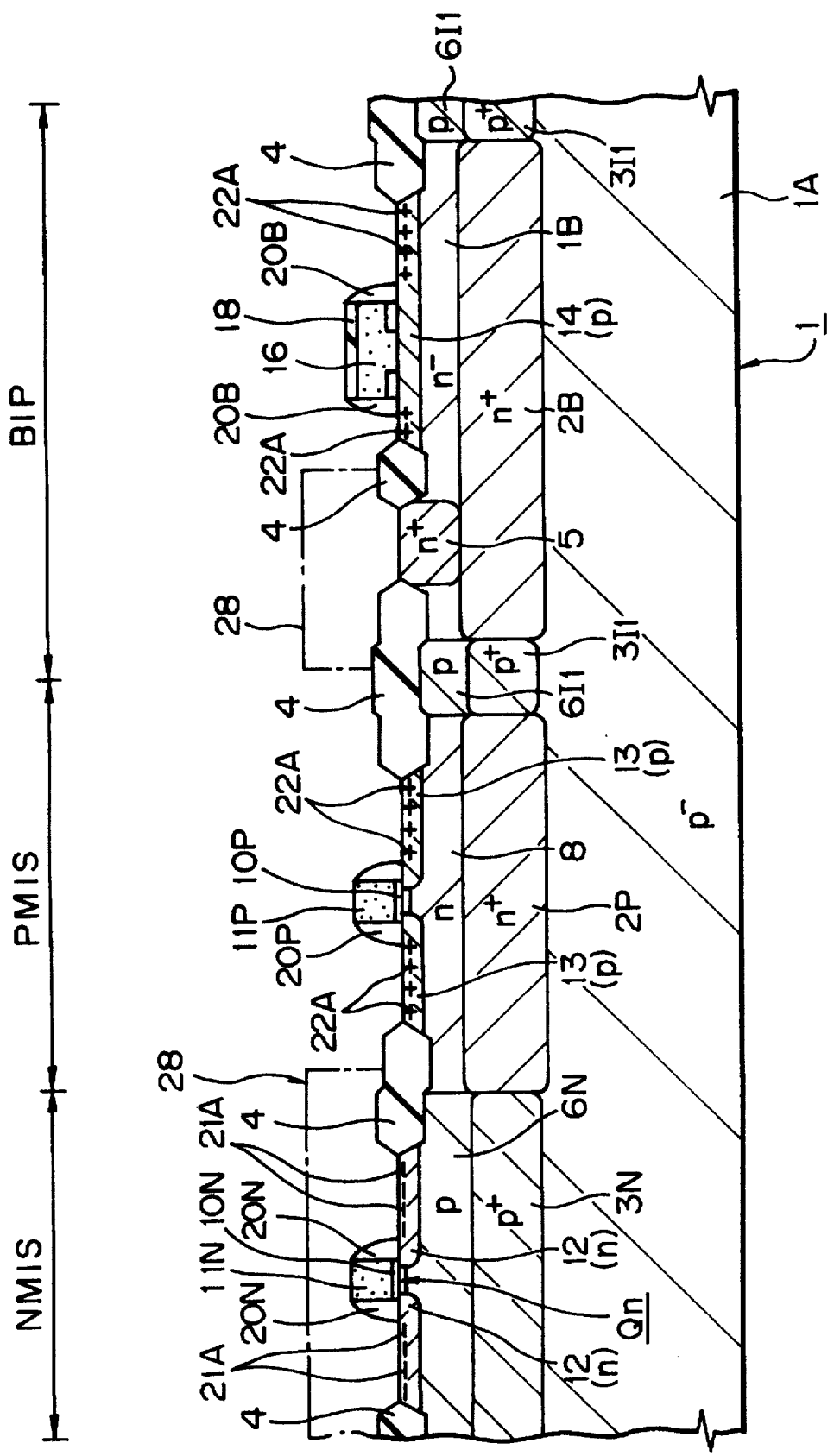
Figure 11:
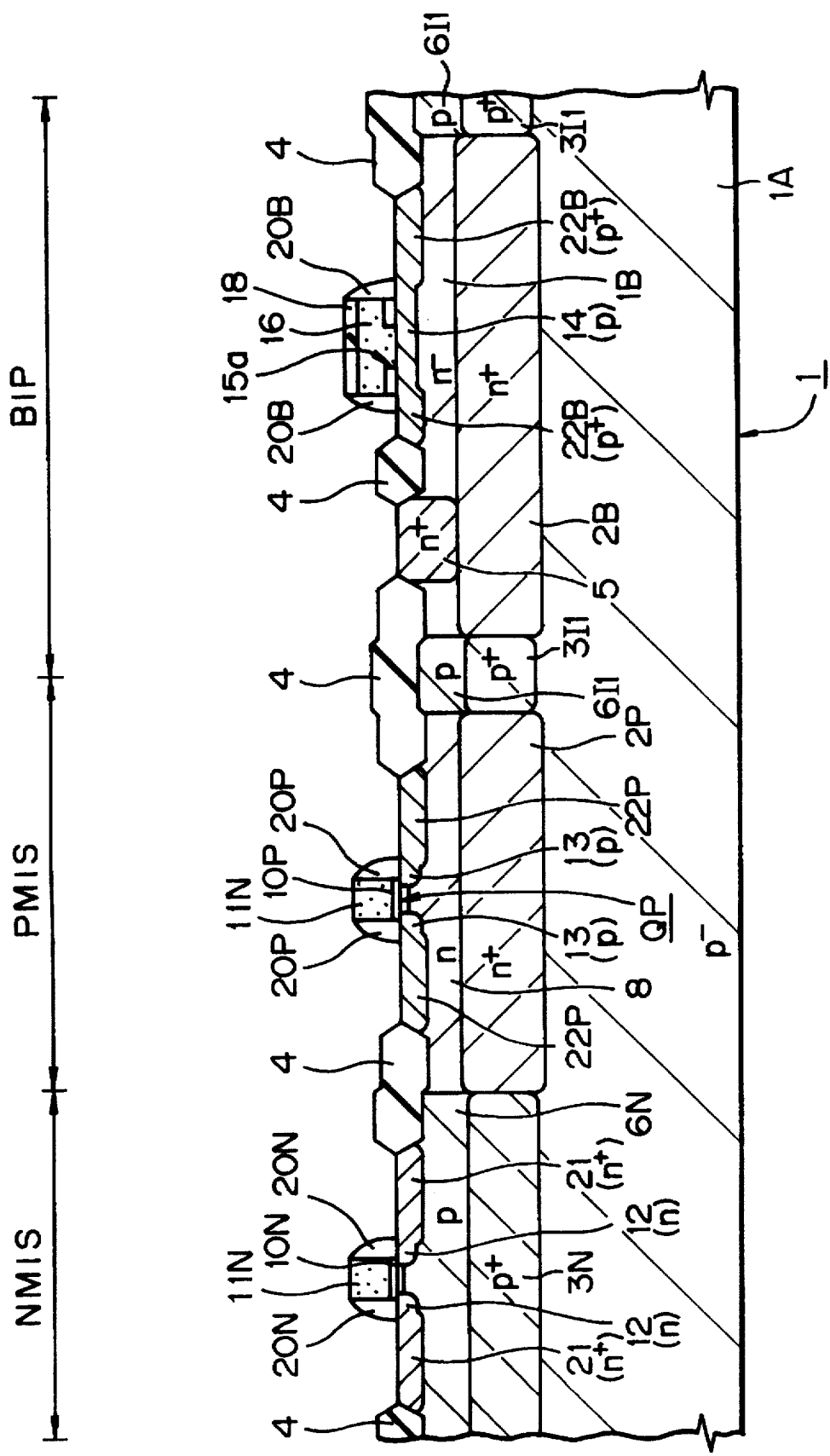

Next, as shown in FIG. 10, a mask 28 is formed which covers the upper surfaces of the portion NMIS of semiconductor substrate 1 and the n$^+$-type semiconductor region 5 for collector contact. The mask 28 is formed of, for example, a photoresist film.

Next, as shown in FIG. 10, by using the mask 28 as a mask for introduction of impurity, a p-type impurity (for example, B or BF$_2$) 22A is selectively introduced, through ion implantation process, into the upper surfaces of the p-type semiconductor regions 13 having their contour defined by the field insulating film 4, gate electrode 11P and side wall spacer 20P and the upper surface of the p-type semiconductor region 14 having its contour defined by the field insulating film 4, emitter electrode 16 and side wall spacer 20B. In this step, the p-type impurity 22A is not introduced into the emitter electrode 16 since the insulating film 18 is formed on the emitter electrode 16. In other words, the insulating film 18 functions as a mask for protection against the introduction of p-type impurity 22A. Thereafter, the mask 28 is removed.

Next, the resulting substrate is heat treated to cause the n-type impurity 21A and p-type impurity 22A to diffuse, thereby forming a pair of n$^+$-type semiconductor regions 21 serving as source and drain regions, a pair of p$^+$-type semiconductor regions 22P also serving as source and drain regions and a p$^+$-type semiconductor region 22B serving as an extrinsic base region. The paired n$^+$-type semiconductor regions 21 serving as source and drain regions are formed in a self-aligned fashion with the field insulating film 4, gate electrode 11N and side wall spacer 20N, the paired p$^+$-type semiconductor regions 22P also serving as source and drain regions are formed in a self-aligned fashion with the field insulating film 4, gate electrode 11P and side wall spacer 20P and the p$^+$-type semiconductor region 22B serving as the extrinsic base region is formed in a self-aligned fashion with the field insulating film 4, emitter electrode 16 and side wall spacer 20B. In this step, an n-channel MISFET Qn and a p-channel MISFET Qp are substantially completed. It should be understood that in the heat treatment step, the n-type impurity 17A in the emitter electrode 16 is diffused into the upper surface of the p-type semiconductor region 14 serving as the base region and consequently, a shallow n$^+$-type semiconductor region 17 serving as an emitter region is formed.

Next, the protective insulating film is removed through, for example, wet etching process to expose silicon on the upper surfaces of the n$^+$-type semiconductor region 5, gate electrodes 11N and 11P, n$^+$-type semiconductor regions 21 and p$^+$-type semiconductor regions 22P and 22B.

Next, a refractory metal film 23 formed of a titanium, tungsten or molybdenum film is formed on a whole surface of semiconductor substrate 1 including the upper surfaces of the exposed n⁺-type semiconductor region 5, gate electrodes 11N and 11P, n⁺-type semiconductor region 21 and p⁺-type semiconductor regions 22P and 22B. In the present embodiment, a titanium film is exemplarily used as the refractory metal film 23 and is formed by deposition through sputtering process. The "refractory metal" is intended to mean a metal which reacts with silicon and forms a silicide having an electric resistance lower than that of silicon.

Figure 12:
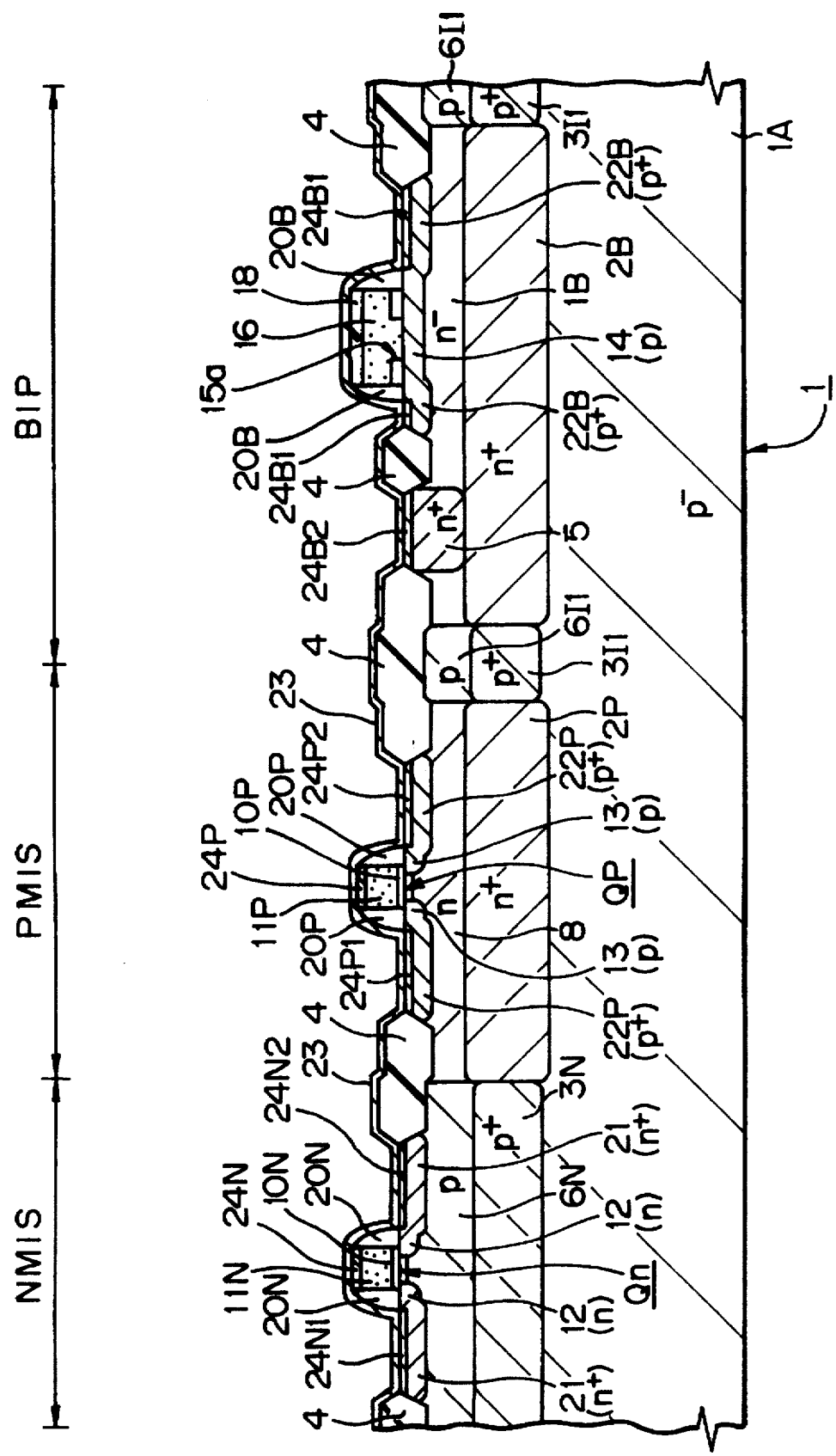

Next, the resulting structure is heat treated at a low temperature of about 500 to 600 [C.°] to cause silicon in each of the n₊-type semiconductor region 5, gate electrodes 11N and 11P, n⁺-type semiconductor regions 21 and p⁺-type semiconductor regions 22P and 22B to react with titanium in the refractory metal film, thereby forming as shown in FIG. 12 a silicide layer (TiSix layer) 24B2 on the upper surface of the n⁺-type semiconductor region 5, a silicide layer 24B1 on the upper surface of the p⁺-type semiconductor region 22B, silicide layers 24P1 and 24P2 on the upper surfaces of the p⁺-type semiconductor regions 22P, a silicide layer 24P on the upper surface of the gate electrode 11P, silicide layers 24N1 and 24N2 on the upper surfaces of the n⁺-type semiconductor regions 21 and a silicide layer 24N on the upper surface of the gate electrode 11N. In this step, any silicide layer 24 is not formed on the upper surface of the emitter electrode 16 since the upper surface of the emitter electrode 16 formed of the polysilicon film 16A is covered with the insulating film 18.

Next, part of refractory metal film 23 which has not been reacted with silicon is selectively removed through, for example, wet etching process.

Next, the resulting structure is heat treated at a high temperature of about 900 to 1000 [C.°] to promote the reaction of the silicide layers with a view of decreasing resistance thereof. In the high-temperature heat treatment, the n-type impurity 17A which has been introduced into the emitter electrode 16 is diffused to the p-type semiconductor region 14 to form an n⁺-type semiconductor region 17 (FIG. 1) serving as an emitter region. Through this, an npn-type bipolar transistor Tr is substantially completed.

Next, an inter-layer insulating film 25 (FIG. 1) is formed on a whole surface of the semiconductor substrate 1. The inter-layer insulating film 25 is formed of a silicon oxide film deposited through, for example, CVD process.

Next, connection holes 25bN, 25bP, 25bB1 and 25bB2 are formed in the inter-layer insulating film 25. Thereafter, a tungsten film, for example, is deposited on a whole surface of the inter-layer insulating film 25 through spattering process and the tungsten film is patterned to form wiring conductors 26N connected to the silicide layers 24N1 and 24N2, wiring conductors 26P connected to the silicide layers 24P1 and 24P2, a wiring conductor 26B1 connected to the silicide layer 24B1 and a wiring conductor 26B2 connected to the silicide layer 24B2, thereby completing a semiconductor integrated circuit device of the present embodiment as shown in FIG. 1.

Thus, according to the present embodiment, operational effects as below can be obtained.

Upon formation of the silicide layers on the upper surfaces of the gate electrode 11N and paired n⁺-type semiconductor regions 21 serving as source and drain regions of the n-channel MISFET Qn and on the upper surface of the p⁺-type semiconductor region 22B serving as extrinsic base region of the npn-type bipolar transistor Tr, the upper surface of the emitter electrode 16 is covered with the insulating film 18 and therefore no silicide layer is formed on the upper surface of the emitter electrode 16. As a result, the resistance of the emitter electrode 16 can be prevented from increasing and the emitter electrode resistance (Re) of the npn-type bipolar transistor Tr can be decreased, thereby increasing the operation speed of the semiconductor integrated circuit device.

Further, since the silicide layers 24N and 24P can be formed on the upper surfaces of the gate electrodes 11N and 1ip of MISFET's Qn and Qp, respectively, the gate resistance of the gate electrodes 11N and 11P can be decreased. As a result, the operation speed of the semiconductor circuit device can be increased.

Further, since the silicide layers 24N1 and 24N2 can be formed on the upper surfaces of the paired n⁺-type semiconductor regions 21 serving as the source and drain regions of the MISFET Qn, the silicide layers 24P1 and 24P2 can be formed on the upper surfaces of the paired p⁺-type semiconductor regions 22B serving as the source and drain regions of the MISFET Qp and the silicide layer 24B1 can be formed on the upper surface of the p⁺-type semiconductor region 22B serving as the extrinsic base region of the npn-type bipolar transistor Tr, the contact resistance can be decreased. As a result, the operation speed of the semiconductor integrated circuit device can be increased.

Since no silicide layer is formed on the upper surface of the emitter electrode 16, the n-type impurity 17A which has been introduced into the emitter electrode 16 can be diffused into the upper surface of the p-type semiconductor region 14 serving as the intrinsic base region and the n⁺-type semiconductor 17 serving as the emitter region can be formed deeply. As a result, the grounded emitter current amplification factor ($h_{FE}$) of the npn-type bipolar transistor Tr can be increased, thereby increasing the operation speed of the semiconductor integrated circuit device. Further, since the n⁺-type semiconductor region 17 serving as emitter region is allowed to have a lateral spread, short-circuit between the emitter electrode 16 and the p-type semiconductor region 14 serving as the base region can be prevented. As a result, reliability of the semiconductor integrated circuit device can be promoted.

(Embodiment 2)

Embodiment 2 is a second embodiment of the present invention directed to application of the present invention to a semiconductor integrated circuit device having two-input NOR gate circuit.

Figure 13:
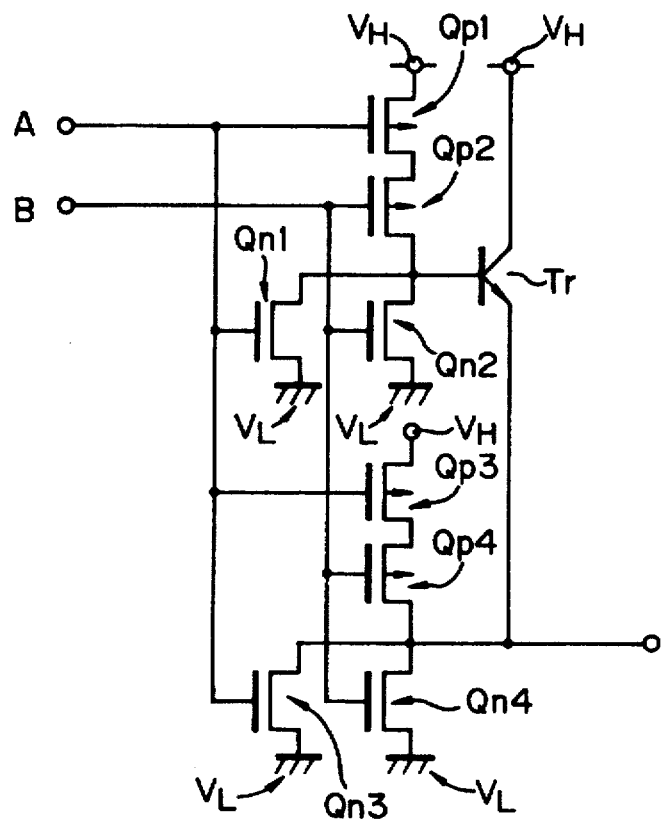
FIG. 13 is an equivalent circuit diagram of a two-input NOR gate circuit carried on a semiconductor integrated circuit device according to a second embodiment of the present invention.
Figure 14A:
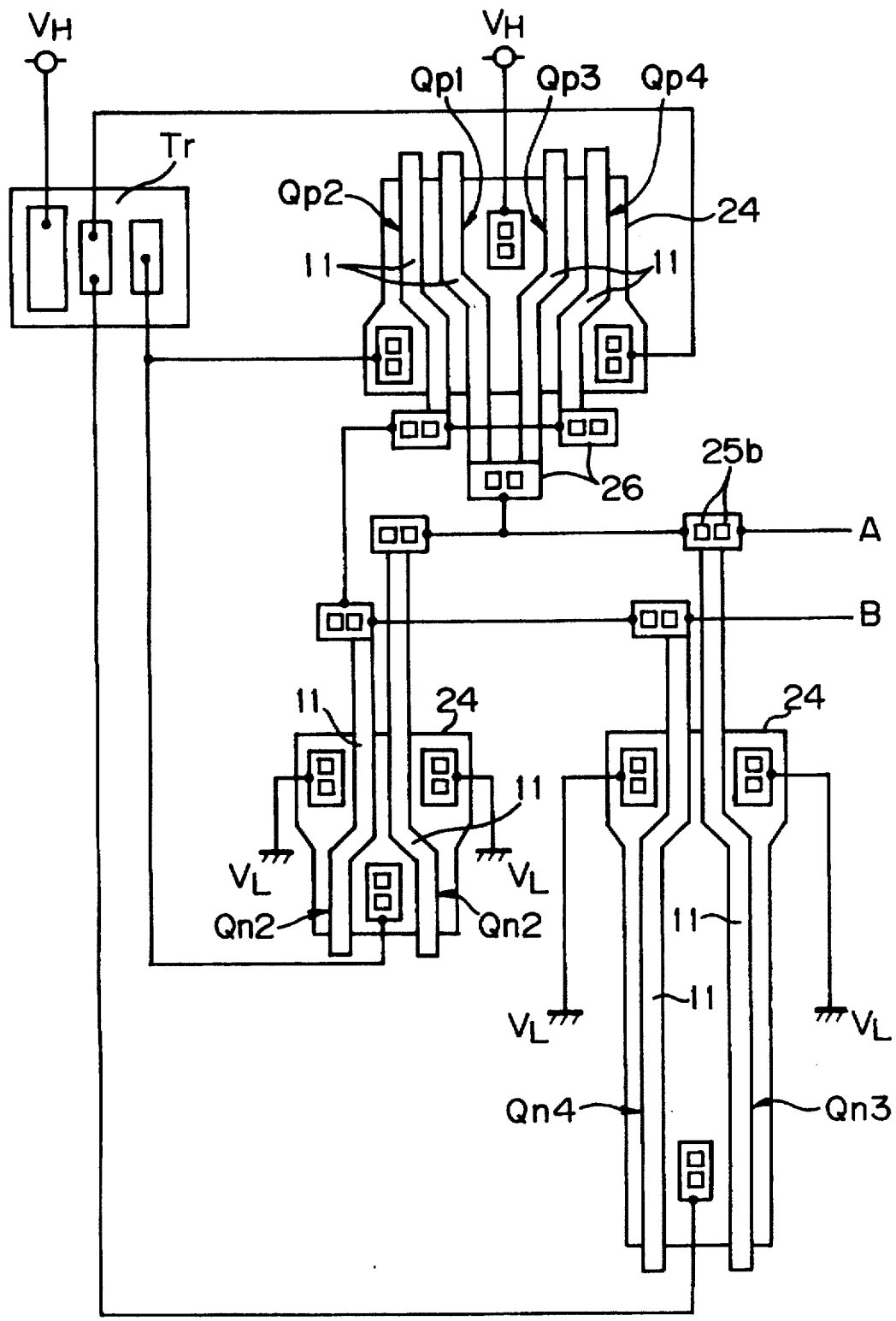
FIG. 14A is a diagram showing an embodiment of a layout according to the present invention of the twoinput NOR gate circuit shown in FIG. 13.
Figure 14B:
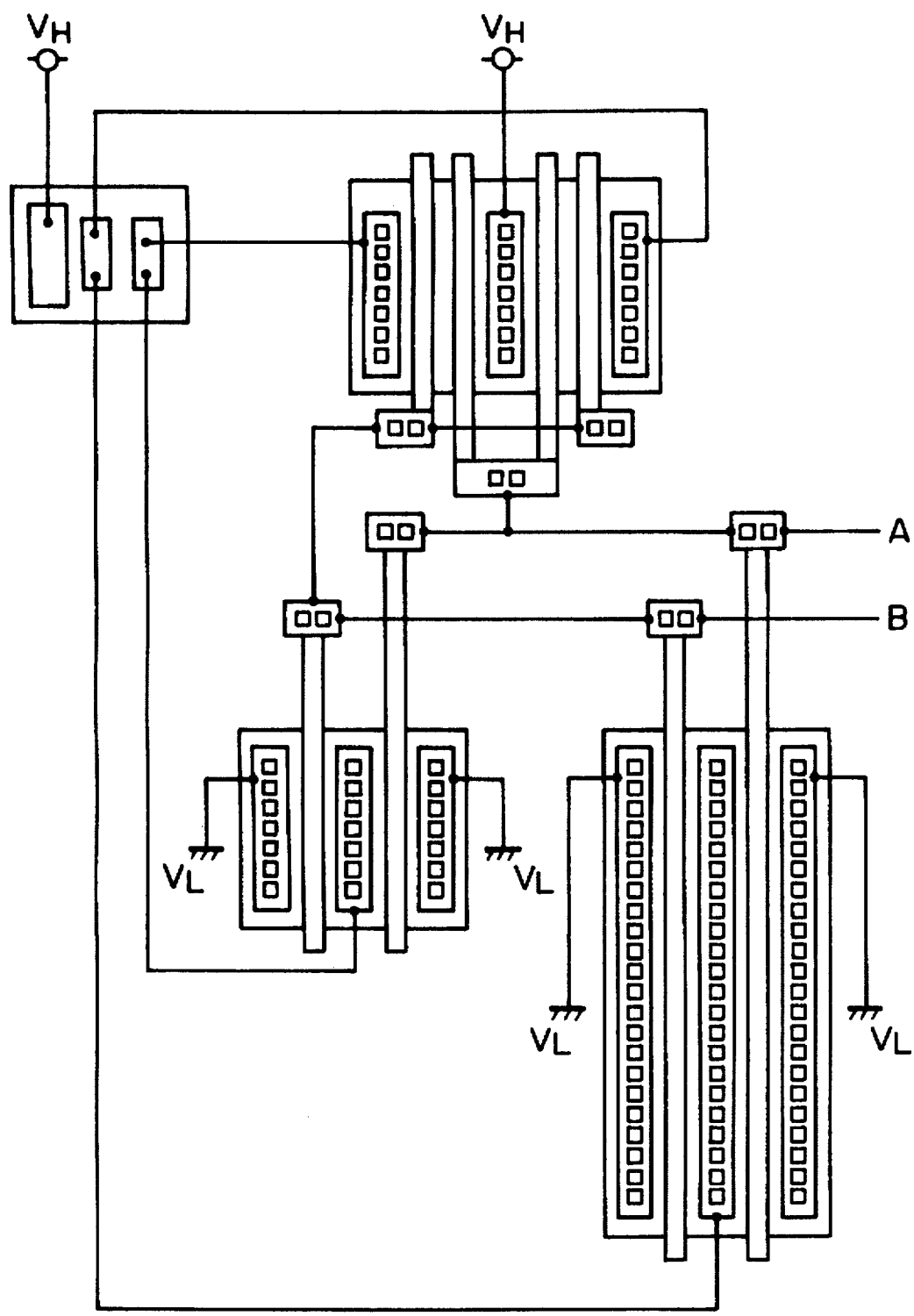
FIG. 14B is a similar diagram of the circuit thought of by the present inventors before the present invention.

The two-input NOR gate circuit carried on the semiconductor integrated circuit device according to the second embodiment of the present invention is shown in FIG. 13 (equivalent circuit diagram) and in FIGS. 14A and 14B (layout diagram).

As shown in FIGS. 13 and 14A, the two-input NOR gate circuit carried on the semiconductor integrated circuit device comprises four n-channel MISFET's Qn1 to Qn4, four p-channel MISFET's Qp1 to Qp4, and a single npn-type bipolar transistor Tr. This two-input NOR gate circuit can be operated at a higher speed than the CMIS gate circuit especially when the load is high. Though not limitative, 0 [V] is supplied to a power supply $V_H$ on the high level side of the circuit and −3 [V] is supplied to a power supply $V_L$ on the low level side.

Each of the four n-channel MISFET's Qn1 to Qn4, each of the four p-channel MISFET's Qp1 to Qp4 and the single npn-type bipolar transistor Tr are formed by the technique for fabrication of the semiconductor integrated circuit device shown in the embodiment 1 described previously. More particularly, the two-input NOR gate circuit comprises the n-channel MISFET including a gate electrode 11, a source region and a drain region each having its upper surface on which a silicide layer (24) is formed, the p-channel MISFET including a gate electrode 11, a source region and a drain region each having its upper surface on which a silicide layer (24) is formed and the npn-type bipolar transistor Tr including an extrinsic base region having its upper surface on which a silicide layer (24) is formed.

In the semiconductor integrated circuit device having the two-input NOR gate circuit described as above, the number of connection holes (25b) for wiring conductors connected to the source and drain regions of the n-channel MISFET and the number of connection holes (25b) for wiring conductors connected to the source and drain regions of the p-channel MISFET can be reduced. Typically, as shown in FIG. 14B, a relatively large number (for example, 5 to 30) of contacts are provided for a wiring conductor connected to each of the source and drain regions, with a view of decreasing contact resistance. In the present embodiment, thanks to the silicide layer formed on the upper surface of each of the source and drain regions, substantial contact resistance is low. Accordingly, the occupation area of each of the n-channel MISFET and p-channel MISFET can be reduced in proportion to a reduction in the number of contacts. Consequently, the degree of integration of the semiconductor integrated circuit device having the two-input NOR gate circuit can be raised.

Since the occupation area of each of the n-channel MISFET and p-channel MISFET can be reduced, parasitic capacitance associated with the source and drain regions of the n-channel MISFET can be reduced and besides, parasitic capacitance associated with the source and drain regions of the p-channel MISFET can be reduced. Consequently, the operation speed of the semiconductor integrated circuit device having the two-input NOR gate circuit can be raised.
(Embodiment 3)

Embodiment 3 is a third embodiment of the present invention directed to application of the present invention to a semiconductor integrated circuit device having memory cells.

Figure 15:
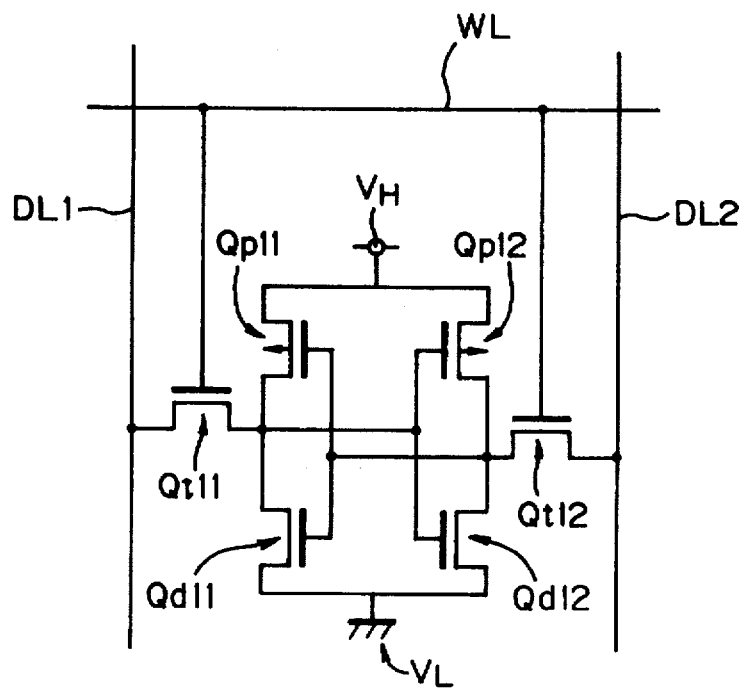
FIG. 15 is an equivalent circuit diagram of a memory cell carried on a semiconductor integrated circuit device according to a third embodiment of the present invention.
Figure 16:
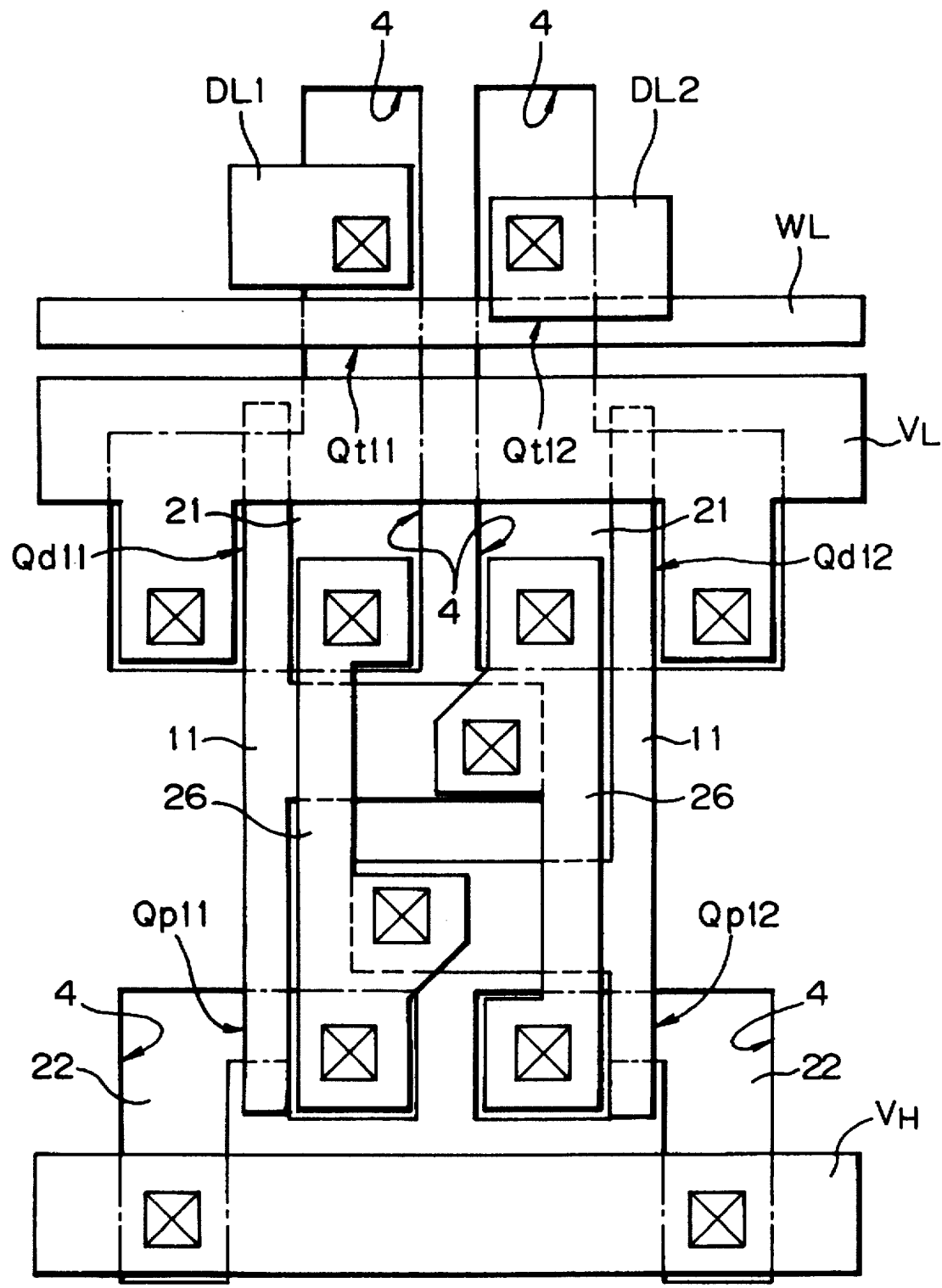
FIG. 16 is a diagram showing an embodiment of a layout according to the present invention of the memory cell shown in FIG. 15.

A memory cell carried on the semiconductor integrated circuit device according to the third embodiment of the present invention is shown in FIG. 15 (equivalent circuit diagram) and in FIG. 16 (layout diagram).

As shown in FIGS. 15 and 16, the memory cell carried on the semiconductor integrated circuit device is arranged at a site where a word line WL intersects first and second data lines DL1 and DL2. A plurality of memory cells are arranged in matrix in a direction in which the word line WL extends and in a direction in which the first data line DL1 (or the second data line DL2) extends to form a memory array.

The memory cell comprises a flip-flop circuit (operational amplifier circuit) including two inverter circuits Qp11, Qd11 and Qp12, Qd12 and two MISFET's for transfer Qt11 and Qt12. In other words, the memory cell is formed of a SRAM (static random access memory).

The flip-flop circuit includes two MISFET's for drive Qd11 and Qd12 and two MISFET's for load Qp11 and Qp12. Each of the two MISFET's Qd11 and Qd12 is of n-channel conductivity type and each of the two MISFET's Qp11 and Qp12 is of p-channel conductivity type. Each of the MISFET's for transfer Qt11 and Qt12 is of n-channel conductivity type. In other words, the memory cell is of a full CMIS (complementary metal insulator semiconductor) structure.

Arranged around the memory cell array are peripheral circuits such as a word driver circuit, a decoder circuit, a write driver circuit and a sense amplifier circuit. These peripheral circuits are formed of semiconductor elements such as for example an n-channel MISFET, a p-channel MISFET, an npn-type bipolar transistor and a resistor element. In other words, a semiconductor integrated circuit device of the present embodiment is of a so-called Bi-CMIS structure in which the complementary MISFET's and the bipolar transistor are coexistent.

The semiconductor integrated circuit device constructed as above can be formed by the technique for fabrication of the semiconductor integrated circuit device shown in the embodiment 1 described previously.

By forming the semiconductor integrated circuit device having the memory cells by the fabrication technique for the semiconductor integrated circuit device shown in the previously-described embodiment 1, the resistance of the word line WL can be decreased to increase the operational speed of the semiconductor integrated circuit device having the memory cells.
(Embodiment 4)

Embodiment 4 is a fourth embodiment of the present invention directed to application of the present invention to a semiconductor integrated circuit device having a p-channel MISFET and a resistor.

Figure 17:
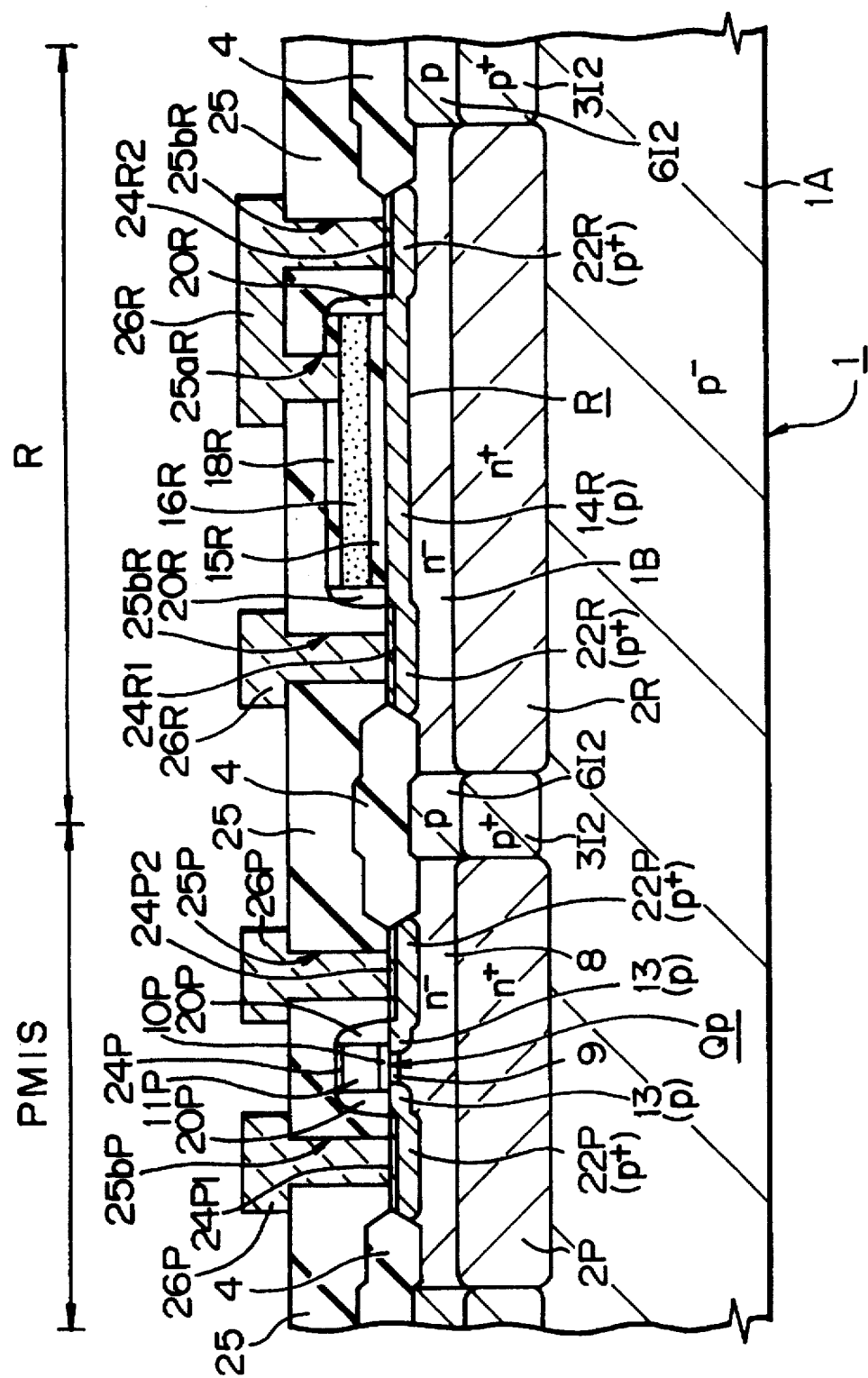
FIG. 17 is a fragmentary sectional view showing the schematic construction of a semiconductor integrated circuit device according to a fourth embodiment of the present invention.

The schematic structure of the semiconductor integrated circuit device according to the fourth embodiment of the present invention is shown in FIG. 17 (fragmentary sectional view).

As shown in FIG. 17, the semiconductor integrated circuit device of the present embodiment is formed using as a main component a semiconductor base 1 which is obtained by growing an n-type epitaxial layer 1B on the upper surface of a p-type semiconductor substrate 1A made of single crystalline silicon through epitaxial growth process. The semiconductor base (substrate) 1 has a surface portion PMIS (active portion) at which a p-channel MISFET Qp is formed and a surface portion (active portion) at which a resistor R is formed.

The p-channel MISFET Qp is formed at the upper surface of an n-type well region 8 having its periphery defined by a field insulating film 4. Like the previously-described embodiment 1, the p-channel MISFET Qp principally includes a threshold value voltage control layer 9, a gate insulating film 10P, a gate electrode 11P, and a pair of p-type semiconductor regions 13 and a pair of p$^+$-type semiconductor regions 22P, the regions 13 and regions 22P being cooperative to serve as source and drain regions.

The gate electrode 11P includes a polysilicon film into which an impurity is introduced and a silicide layer 24P formed on the polysilicon film. The silicide layer 24P is formed in a self-aligned fashion with a side wall spacer 20P covering the side surface of the gate electrode 11P.

With the aim of decreasing contact resistance, silicide layers 24P1 and 24P2 are formed on the upper surfaces of the paired p$^+$-type semiconductor regions 22P serving as the source and drain regions, respectively. Each of the silicide layers 24P1 and 24P2 is formed in a self-aligned fashion with the side wall spacer 20P covering the side surface of the gate electrode 11P. A wiring conductor 26P is electrically connected to each of the silicide layers 24P1 and 24P2 through a connection hole 25bP formed in an inter-layer insulating film 25.

In the portion having its periphery defined by the field insulating film 4, the resistor R includes a resistive region formed of a p-type semiconductor region 14R formed in the upper surface of the n-type epitaxial layer 1B. A substantial part of the upper surface of the p-type semiconductor region (resistive region) 14R is covered with an insulating film 15R. A polysilicon film 16A (see FIG. 6), formed through the same step as that for an emitter electrode 16, and an insulating film 18 (see FIG. 7) both formed on the insulating film 15R are patterned to form a polysilicon film 16R and an insulating film 18R.

Formed in a part of the upper surface of the n-type epitaxial layer 1B in the portion R are a pair of $p^+$-type semiconductor regions 22R serving as contact regions. With the aim of decreasing contact resistance, silicide layers 24R1 and 24R2 are formed on the upper surfaces of the paired $p^+$-type semiconductor regions 22R. Each of the silicide layers 24R1 and 24R2 is formed in a self-aligned fashion with a side wall spacer 20R covering the side surface of the polysilicon film 16R.

A wiring conductor 26R is electrically connected to each of the silicide layers 24R1 and 24R2 formed on the upper surfaces of the paired $p^+$-type semiconductor regions 22R through a connection hole 25bR formed in the inter-layer insulating film 25. With the aim of stabilizing potential on the polysilicon film 16R to thereby stabilize resistance of the resistor R, the wiring conductor 26R is electrically connected also to the polysilicon film 16R through a connection hole 25aR formed in both the insulating film 18R and the inter-layer insulating film 25. Accordingly, the polysilicon film 16R is electrically connected to one of the silicide layers 24R1 and 24R2 formed on the upper surfaces of the $p^+$-type semiconductor regions 22R, for example, silicide layer 24R2 by way of the wiring conductor 26R.

Next, a method for fabrication of the semiconductor integrated circuit device will be described in brief.

Firstly, a p-type semiconductor substrate 1A made of single crystalline silicon is prepared.

Next, an $n^+$-type semiconductor region 2P is formed in the upper surface of a PMIS forming portion of the p-type semiconductor substrate 1A, an $n^+$-type semiconductor region 2R is formed in the upper surface of an R forming portion and a $p^+$-type semiconductor region 3I2 is formed in the upper surfaces of inactive portions. Simultaneously with the formation of the epitaxial layer 1B at the portion BIP for formation of the bipolar transistor Tr as shown in FIG. 3, the n-type epitaxial layer 1B is grown on the upper surface of the p-type semiconductor substrate 1A. Thanks to the growth of the n-type epitaxial layer 1B, $p^+$-type buried semiconductor regions 3I1 and 3I2 and an $n^+$-type buried semiconductor region 2R are formed. Also, a semiconductor base (substrate) 1 is completed in which the n-type epitaxial layer 1B is grown on the upper surface of the p-type semiconductor substrate 1A.

Next, a field insulating film 4 for defining the peripheries of surface portions PMIS and R is formed on the upper surface of the resulting semiconductor substrate 1.

Next, an n-type well region 8 is formed at the upper surface of the PMIS forming portion of the semiconductor substrate 1. Subsequently, a p-type impurity is introduced into the upper surface of the substrate 1 to form a p-type region 611 in the epitaxial layer in the inactive portion. Thereafter, a threshold value voltage control layer 9 is selectively formed on the upper surface of the n-type well region 8.

Next, a gate electrode 1ip is formed on the upper surface of the n-type well region 8 through the medium of a gate insulating film 10P. The gate electrode 11P is formed of a polysilicon film into which an impurity is introduced.

Next, a pair of p-type semiconductor regions 13 serving as source and drain regions are formed in the upper surface of the n-type well region 8. Each of the paired p-type semiconductor regions 13 is formed in a self-aligned fashion with the gate electrode 11P and field insulating film 4.

Next, simultaneously with the formation of the p-type semiconductor region 14 at the portion BIP shown in FIG. 5, a p-type semiconductor region 14R serving as a resistive region is formed at the portion R of the semiconductor substrate 1. Thereafter, simultaneously with the formation of the insulating film 15 at the portion BIP shown in FIG. 6, an insulating film for formation of an insulating film 15R at a substantial portion (other than portions for formation of the contact regions 22R) of the p-type semiconductor region 14R is formed on a whole surface of the semiconductor substrate 1.

Next, simultaneously with the formation of the polysilicon film 16A at the portion BIP shown in FIG. 6 and of the insulating film 18 at the portion BIP shown in FIG. 7, a polysilicon film and an insulating film which are for forming a polysilicon film 16R and an insulating film 18R, respectively, are formed on the upper surface of that insulating film. After the introduction of the impurity 17A into the film 16A at the portions PMIS and BIP shown in FIG. 6, the films 18 and 16 shown in FIG. 8 are patterned to form the polysilicon film 16R and insulating film 18R simultaneously with the formation of the emitter electrode 16. An insulating film is formed on a whole surface of semiconductor substrate 1 including the upper surface of film 18R and the side surface of film 16R. Thereafter, like the formation of the side wall spacer 20B at the portion BIP shown in FIG. 9, that insulating film as well as the insulating film for the film 15R is subjected to anisotropic etching such as RIE to form a side wall spacer 20P covering the side surface of the gate electrode 11P and a side wall spacer 20R covering the side surface of the polysilicon film 16R and at the same time, to expose the upper surfaces of the p-type semiconductor regions 13 and 14R.

Next, simultaneously with the introduction of the p-type impurity into the region 14 at the portion BIP shown in FIG. 10, a p-type impurity is introduced into the upper surfaces of p-type semiconductor regions 13 having their contour defined by the field insulating film 4, gate electrode 11P and side wall spacer 20P, a p-type impurity is introduced into the upper surface of p-type semiconductor region 14R having its contour defined by the field insulating film 4, insulating film 15R and side wall spacer 20R. The resulting substrate is heat treated to form a pair of $p^+$-type semiconductor regions 22P serving as source and drain regions and the paired $p^+$-type semiconductor regions 22R serving as contact regions of resistor R.

Next, simultaneously with the formation of the silicide layers 24B1 and 24B2 at the portion BIP shown in FIG. 12, a silicide layer 24P is formed on the upper surface of the gate electrode 11P in a selfaligned fashion with the side wall spacer 20P, silicide layers 24P1 and 24P2 are formed on the upper surfaces of the paired $p^+$-type semiconductor regions 22P serving as the source and drain regions in a self-aligned fashion with the side wall spacer 20P and silicide layers 24R1 and 24R2 are formed on the upper surfaces of the paired $p^+$-type semiconductor regions 22R serving as the contact regions in a self-aligned fashion with the side wall spacer 20R.

Thereafter, an inter-layer insulating film 25 is formed, connection holes 25a R, 25b P and 25b R are formed in the inter-layer insulating film 25 and then wiring conductors 26P connected to the silicide layers 24P1 and 24P2 and wiring conductors 26R connected to the silicide layers 24R1 and 24R2 are formed, thus substantially completing a semiconductor integrated circuit device of the present embodiment.

According to the present embodiment, upon formation of the silicide layer 24P on the upper surface of the gate electrode lip of the p-channel MISFET Qp, the silicide layers 24P1 and 24P2 on the upper surfaces of the paired p$^+$-type semiconductor regions 22P serving as source-and drain regions of the MISFET Qp and the silicide layers 24R1 and 24R2 on the upper surfaces of the paired p$^+$-type semiconductor regions 22R serving as contact regions, the upper surface of the p-type semiconductor region 14R is covered with the insulating film 15R and hence no silicide layer is formed on the upper surface of the p-type semiconductor region 14R. As a result, variations in resistance of the resistor R can be suppressed to permit formation of a miniature resistor R, thereby promoting electrical reliability and the degree of integration of the semiconductor integrated circuit device.

Further, the steps for formation of the resistor R and the insulating film 15R, polysilicon film 16R and insulating film 18R which are adapted to prevent the resistor R from becoming silicide can be totally in common to the steps for formation of the npn-type bipolar transistor Tr shown in the foregoing embodiment 1 and therefore, the number of steps for fabrication of the semiconductor integrated circuit device can be reduced.

(Embodiment 5)

Embodiment 5 is a fifth embodiment of the present invention directed to application of the present invention to a semiconductor integrated circuit device having a p-channel MISFET and a resistor.

Figure 18:
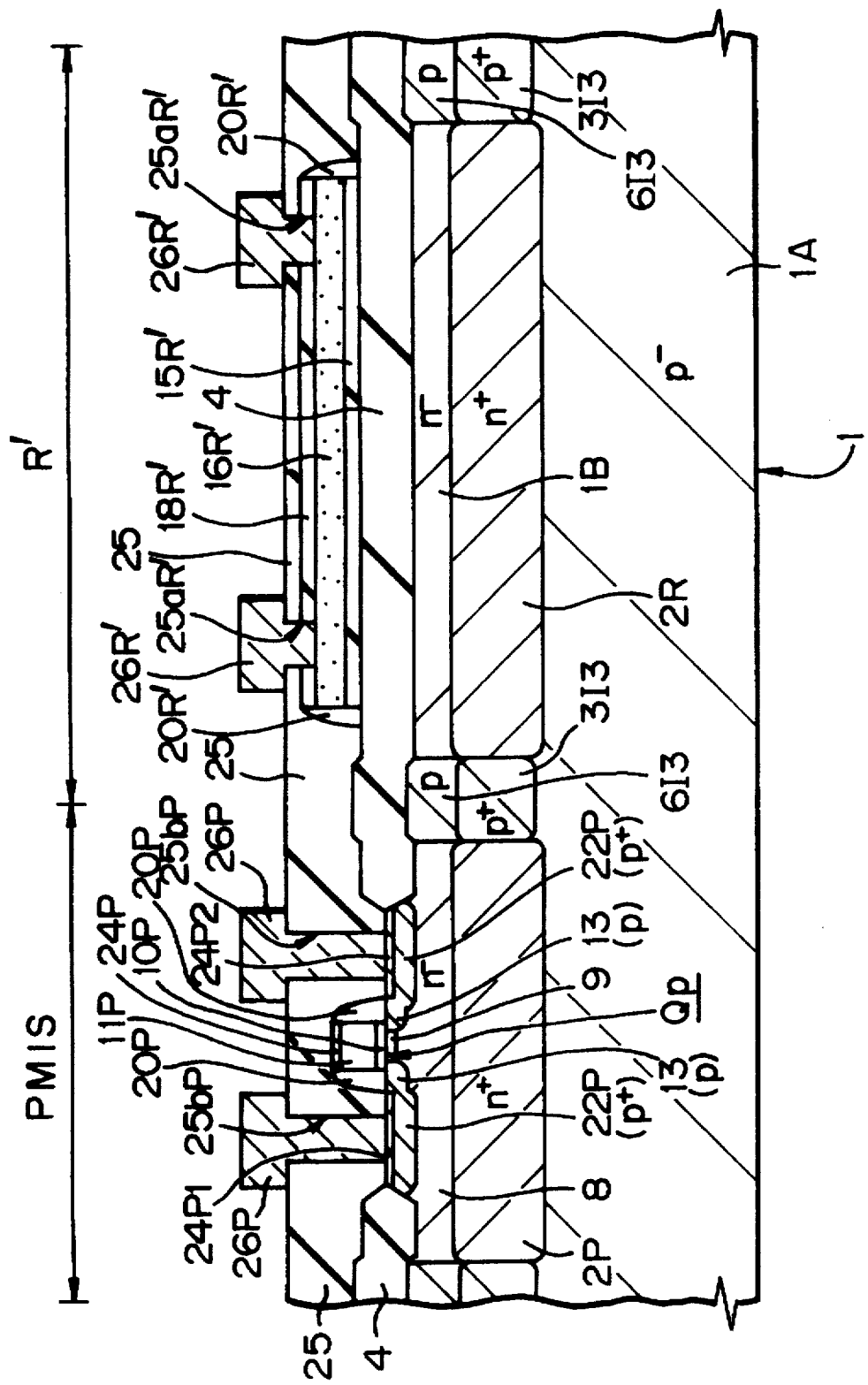
FIG. 18 is a fragmentary sectional view showing the schematic construction of a semiconductor integrated circuit device according to a fifth embodiment of the present invention.

The schematic construction of the semiconductor integrated circuit device according to the fifth embodiment of the present invention is shown in FIG. 18 (fragmentary sectional view).

Like the embodiment shown in FIG. 1, the semiconductor integrated circuit device of the present embodiment principally comprises a semiconductor base (substrate) 1. In the semiconductor substrate 1, a p-channel MISFET Qp is formed at a surface portion (active portion) PMIS and a resistor element region R' is formed at a surface portion (active portion) R'.

The p-channel MISFET Qp is formed in the upper surface of an n-type well region 8 having its periphery defined by a field insulating film 4. Like the foregoing embodiment 1, the p-channel MISFET Qp includes a threshold value voltage control layer 9, a gate insulating film 10P, a gate electrode 11P, and a pair of p-type semiconductor regions 13 and a pair of p$^+$-type semiconductor regions 22P, the regions 13 and P being cooperative to serve as source and drain regions.

The gate electrode 11P includes a polysilicon film into which an impurity is introduced and a silicide layer 24P formed on the upper surface of the polysilicon film. The silicide layer 24P is formed in a self-aligned fashion with a side wall spacer 20P covering the side surface of the gate electrode 11P.

With the aim of decreasing contact resistance, silicide layers 24P1 and 24P2 are respectively formed on the upper surfaces of the paired p$^+$-type semiconductor regions 22P serving as the source and drain regions. Each of the silicide layers 24P1 and 24P2 is formed in a self-aligned fashion with the side wall spacer 20P covering the side surface of the gate electrode 11P. A wiring conductor 26P is electrically connected to each of the silicide layers 24P1 and 24P2 through a connection hole 25b P formed in an inter-layer insulating film 25.

In the resistor element region, a polysilicon film 16R' is formed on a part of field insulating film, overlying an epitaxial layer 1B in the surface portion R', through the medium of an insulating film 15R'. The upper surface of the polysilicon film 16R' is covered with an insulating film 18R'.

A wiring conductor 26R' is electrically connected to one end of the polysilicon film 16R' through a connection hole 25a R' formed in the insulating film 18R' and inter-layer insulating film 25. Similarly, a wiring conductor 26R' is electrically connected to the other end of the polysilicon film 16R' through a connection hole 25a R' formed in the insulating film 18R' and inter-layer insulating film 25.

Next, a method for fabrication of the semiconductor integrated circuit device will be described in brief.

Firstly, a p-type semiconductor substrate 1A made of single crystalline silicon is prepared.

Next, an n$^+$-type semiconductor region 2P is formed in the surface portion PMIS of the p-type semiconductor substrate 1A, an n$^+$-type semiconductor region 2R' is formed at the surface portion R' and p$^+$-type semiconductor regions 3121 and 3122 are formed at the inactive portions. Synchronously with the formation of the layer 1B at the portion BIP shown in FIG. 3, an n-type epitaxial layer 1B is grown on the upper surface of the p-type semiconductor substrate 1A through epitaxial growth process. A p$^+$-type buried semiconductor region 313 and an n$^+$-type buried semiconductor region 2P are formed between the n-type epitaxial layer 1B and the substrate 1. Also, a semiconductor base (substrate) 1 is completed in which the n-type epitaxial layer 1B is grown on the upper surface of the p-type semiconductor substrate 1A.

Next, a field insulating film 4 for defining the surface portion PMIS is formed on the upper surface of the resulting semiconductor substrate 1.

Next, an n-type well region 8 is formed in the surface portion PMIS of the semiconductor substrate 1. Subsequently, a p-type impurity is introduced into the upper surface of the substrate 1 to form a p-type region 613 in the epitaxial layer in the inactive portion. Thereafter, a threshold value voltage control layer 9 is selectively formed in the upper surface of the n-type well region 8.

Next, a gate electrode 11P is formed on the upper surface of the n-type well region 8 through the medium of a gate insulating film 10P. The gate electrode 11P is formed of a polysilicon film into which an impurity is introduced.

Next, a pair of p-type semiconductor regions 13 serving as source and drain regions are formed in a part of the upper surface of the n-type well region 8. Each of the paired p-type semiconductor regions 13 is formed in a self-aligned fashion with the gate electrode 11P and field insulating film 4.

Next, simultaneously with the formation of the insulating film 15 and polysilicon film 16A at the portion BIP shown in FIG. 6, an insulating film 15R', an insulating film for formation of a polysilicon film 16R' and a polysilicon film are formed sequentially on a whole surface of semiconductor substrate 1 including the upper surface of the field insulating film 4. Thereafter, an n-type impurity is introduced into the upper surface of the polysilicon film.

Next, simultaneously with the formation of the insulating film 18 on the polysilicon film 16A at the portion BIP shown in FIG. 7, an insulating film is formed on a whole surface of the polysilicon film. Thereafter, upon execution of patterning shown in FIG. 8, the insulating film for film 18R' and the polysilicon film for film 16R' are patterned, so that a resistor element R formed of the polysilicon film 16R' and having its upper surface covered with the insulating film 18R' is formed on the field insulating film 4 through the insulating film 15R' in the R forming portion.

Next, like the formation of the side wall spacer 20B at the portion BIP shown in FIGS. 8 and 9, a side wall spacer 20P covering the side surface of the gate electrode 11P and a side wall spacer 20R' covering the side surface of the resistor element R (polysilicon film 16R') are formed.

Next, a p-type impurity is introduced into the upper surfaces of the p-type semiconductor regions 13 having their contour defined by the field insulating film 4, gate electrode 11P and side wall spacer 20P to form a pair of p⁺-type semiconductor regions 22P serving as source and drain regions.

Next, silicide layers 24P, 24P1 and 24P2 are formed, in a self-aligned fashion with the side wall spacer 20P, on the upper surfaces of the gate electrode 11P and paired p⁺-type semiconductor regions 22P serving as the source and drain regions.

Thereafter, following formation of an inter-layer insulating film 25 and formation of connection holes 25a R' and 25b P in the inter-layer film 25, wiring conductors 26P connected to the silicide layers 24P1 and 24P2 are formed, thus substantially completing a semiconductor integrated circuit device of the present embodiment.

According to the present embodiment, upon the formation of the silicide layer 24P on the upper surface of the gate electrode 11P of the p-channel MISFET Qp and the silicide layers 24P1 and 24P2 on the upper surfaces of the paired p⁺-type semiconductor regions 22P serving as source and drain regions of the MISFET Qp, the upper surface of the polysilicon film 16R' serving as the resistor element region is covered with the insulating film 18R' and hence any silicide layer is not formed on the upper surface of the polysilicon film 16R'. As a result, variations in resistance of the resistor element region 16R', accordingly, the resistor can be suppressed and electrical reliability of the semiconductor integrated circuit device can be promoted.

Further, in the present embodiment, too, the steps for formation of the polysilicon film 16R' serving as the resistor element region and the insulating film 18R' for preventing the polysilicon film 16R' from becoming silicide can be totally in common to the steps for formation of the npn-type bipolar transistor Tr shown in the previously-described embodiment 1 and therefore the number of steps of fabrication of the semiconductor integrated circuit device can be reduced.

(Embodiment 6)

Embodiment 6 is a sixth embodiment of the present invention directed to application of the present invention to a microprocessor (semiconductor integrated circuit device).

Figure 19:
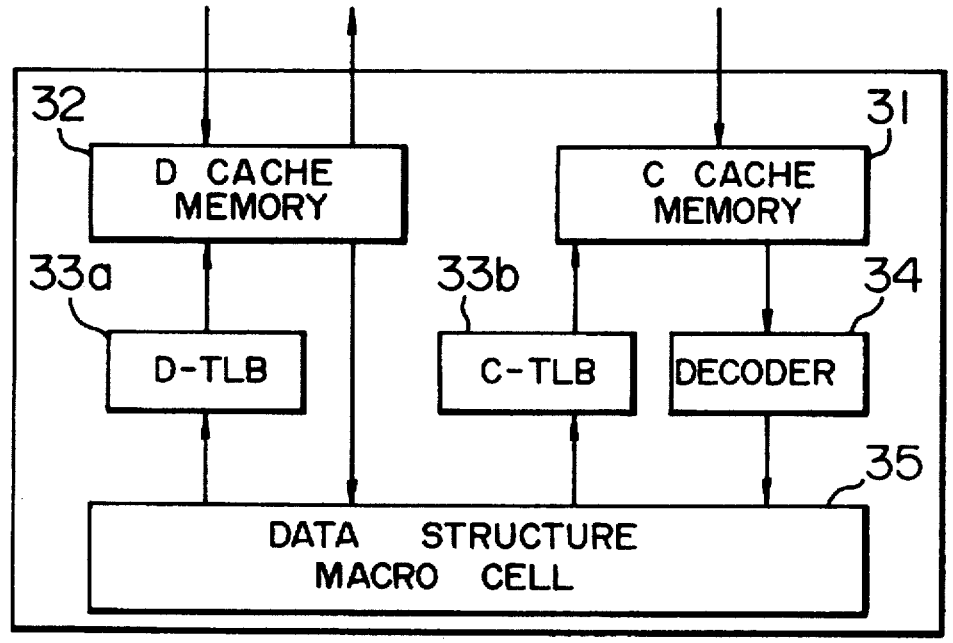
FIG. 19 is a block diagram showing the schematic construction of a microprocessor according to a sixth embodiment of the present invention.

The schematic construction of the microprocessor according to the sixth embodiment of the present invention is shown in FIG. 19 (block diagram).

As shown in FIG. 19, the microprocessor of the present embodiment principally comprises a C cache memory 31 for receiving instructions, a decoder 34, a data structure macro cell (DS macro cell) for executing an arithmetic processing on the basis of an output signal of the decoder 34 to deliver a result of the arithmetic processing, a D cache memory 32 for storing the arithmetic processing result, a code translation look aside buffer (C-TLB) 33b for designating an address for reading the next instruction after the arithmetic processing from the C cache memory, and a D-TLB 33a for converting a logical address of the arithmetic processing result into a physical address of the D cache and designating storage of data.

In the microprocessor, a CMIS circuit or a Bi-CMIS logical gate circuit is used at a portion for execution of operation excepting memory cells and therefore, by forming that portion using the fabrication technique of the previously-described embodiment 1, the operation speed of the microprocessor can be increased.

(Embodiment 7)

Embodiment 7 is a seventh embodiment of the present invention directed to application of the present invention to a SRAM (semiconductor integrated circuit device).

Figure 20:
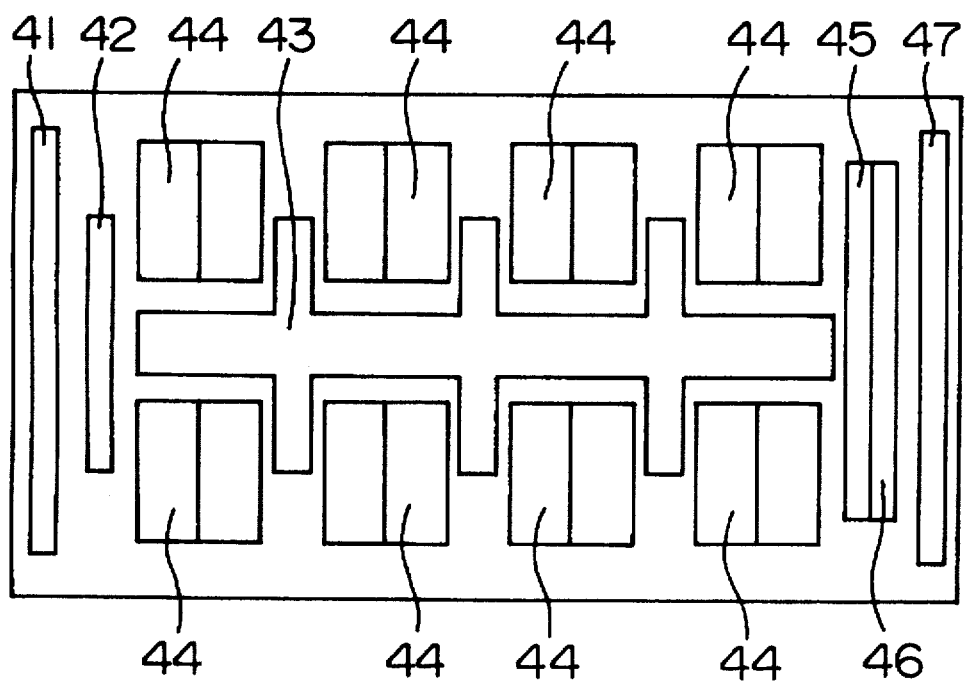
FIG. 20 is a block diagram showing the schematic construction of a SRAM according to a seventh embodiment of the present invention.

The schematic construction of the SRAM according to the seventh embodiment of the present invention is shown in FIG. 20 (block diagram). 10 As shown in FIG. 20, the SRAM of the present embodiment principally comprises an input pad 41 into which an address signal is inputted, an input buffer 42 for receiving the address signal, a decoder 43 for selecting an address on the basis of a signal from the input buffer 42, memory cells 44 each having a specified address to hold information, a sense amplifier 45 for amplifying the information from the memory cells, an output buffer 46 for delivering an output signal from the sense amplifier 45 to the succeeding circuit, and a signal output pad 47.

In the SRAM as above, a logical gate circuit of each of the input buffer 42 and decoder 43 is formed using the technique for fabrication of the foregoing embodiment 1, thereby increasing the operational speed of the SRAM.

In the foregoing description, the invention achieved by the present inventors has been described specifically by way of the foregoing embodiments but the present invention is in no way limited to the foregoing embodiments but may obviously be changed or modified without departing from the gist of the present invention.

For example, the present invention can be applied to a semiconductor integrated circuit device constructed of a semiconductor base of a so-called SOI (Silicon On Insulator) in which a single crystalline silicon substrate is laminated on the upper surface of a single crystalline silicon substrate through an insulating film.

The present invention can also be applied to a semiconductor integrated circuit device constructed of a semiconductor base formed of a single crystalline silicon substrate.

We claim:

1. A method of fabricating a semiconductor device having a MISFET and a bipolar transistor, comprising the steps of:

selectively doping a silicon semiconductor substrate with impurities for different conductivity types to form a first semiconductor region in a first surface portion of said semiconductor substrate and a second semiconductor region in a second surface portion of said semiconductor substrate, said first and second surface portions of said silicon semiconductor substrate being provided for said MISFET and said bipolar transistor, respectively;

forming an epitaxial layer on said first and second surface portions of said semiconductor substrate;

forming a gate electrode over a portion of said epitaxial layer on said first surface portion of said semiconductor substrate, said gate electrode being insulated from said first surface portion of said semiconductor substrate;

introducing an impurity into said epitaxial layer on said second surface portion of said semiconductor substrate to form therein a base region;

forming a first insulating film on a whole surface of the resulting substrate including upper and side surfaces of said gate electrode and said base region;

opening a hole in a part of said first insulating film on said base region to expose a part of said base region;

forming a doped polysilicon film on said first insulating film and on the exposed part of said base region;

forming a second insulating film on said doped polysilicon film;

patterning said second insulating film and said doped polysilicon film so that a remaining second insulating film and a remaining doped polysilicon film remain on said exposed part of said base region and on a peripheral portion of said first insulating film defining said hole therein, said remaining doped polysilicon film covered with said remaining second insulating film serving as an emitter electrode;

forming insulating spacers on side surfaces of said gate electrode and side surfaces of said emitter electrode;

removing said first insulating film except for said peripheral portion of said first insulating film defining said hole;

introducing an impurity into said epitaxial layer in said first surface portion of said substrate and an impurity into said base region on said second surface portion of said substrate, in a self-aligned fashion with said gate electrode and said emitter electrode covered with said remaining second insulating film, in which said emitter electrode is protected from said impurity introduction by the remaining second insulating film;

heat treating the resulting substrate to cause said impurity introduced into said epitaxial layer to diffuse to form source/drain regions in said epitaxial layer, to cause said impurity introduced into said base region to diffuse to form an intrinsic base region under said emitter electrode and an extrinsic base region surrounding said intrinsic base region in said epitaxial layer on said second surface portion of said semiconductor substrate, and to cause diffusion of said impurity from said remaining doped polysilicon film of said emitter electrode into said base region through said hole to form an emitter region in said intrinsic base region;

forming a refractory metal film on a whole surface of the resulting substrate including upper surfaces of said gate electrode and of said emitter electrode and surfaces of said insulating spacers of said gate electrode and emitter electrode, in which said emitter electrode is protected from formation thereon of said refractory metal film by the remaining second insulating film; and heat treating the resulting substrate to form silicide layers on said source/drain regions in said epitaxial layer, on said gate electrode, and on said extrinsic base region.

2. A method according to claim 1, wherein said doped polysilicon film forming step includes forming a polysilicon film on said first insulating film and on the exposed part of said base region and introducing an impurity into said polysilicon film.

3. A method according to claim 1, wherein said insulating spacer forming step includes forming a third insulating film on a whole surface of the resulting substrate including upper and side surfaces of said emitter electrode and including said first insulating film and performing isotropic etching of said third insulating film and said first insulating film.

4. A method according to claim 1, wherein said impurity introduction into said epitaxial layer on said first surface portion of said substrate and said impurity introduction into said base region on said second surface portion of said substrate are performed in a single step, and said source/drain regions and said extrinsic base region are of the same conductivity type.

5. A method according to claim 1, wherein said second insulating film is a silicon oxide film.

6. A method according to claim 1, wherein, in said patterning step, the first insulating film is not removed.

7. A method according to claim 1, wherein the step of forming the insulating spacers includes forming an insulating layer over the substrate and performing etching to form the insulating spacers from the insulating layer, and wherein the removing the first insulating film is performed when performing said etching.

8. A method according to claim 7, wherein after the step of forming the insulating spacers the emitter electrode is entirely covered by the remaining second insulating film and the insulating spacers on the side surfaces of the emitter electrode.

9. A method according to claim 1, wherein after the step of forming the insulating spacers the emitter electrode is entirely covered by the remaining second insulating film and the insulating spacers on the side surfaces of the emitter electrode.

10. A method according to claim 1, wherein the heat treating to form silicide layers includes a first treatment at a first temperature to form a silicide, and a second treatment at a second temperature to reduce an electrical resistance of the silicide, the second temperature being higher than the first temperature.

11. A method according to claim 10, wherein a part of the refractory metal film is not reacted to form the silicide layers, and wherein the method further comprises removing unreacted refractory metal film after the first treatment and before the second treatment.

12. A method according to claim 1, wherein a part of the refractory metal film is not reacted to form the silicide layers, and wherein the method further comprises removing unreacted refractory metal film.

13. A method of fabricating a semiconductor device, comprising the steps of:

(a) forming a gate electrode of a MISFET on a first surface portion of a silicon substrate, via a gate insulating film, said gate electrode being formed of silicon;

(b) forming a base region of a first conductivity type of a bipolar transistor on a second surface portion of said silicon substrate, said second surface portion being different from said first surface portion;

(c) forming a silicon film including first impurities of a second conductivity type on said substrate, said second conductivity type being opposite to said first conductivity type;

(d) forming a first insulating film on said silicon film;

(e) patterning said first insulating film and said silicon film by etching, so that a part of said first insulating film and a part of said silicon film selectively remain on a surface of said base region of said bipolar transistor, said part of said silicon film being used as an emitter electrode of said bipolar transistor;

(f) forming a second insulating film on a whole surface of said silicon substrate including side surfaces of said gate electrode and of said part of said silicon film;

(g) anistropically etching said second insulating film to selectively leave parts of said second insulating film on side surfaces of said gate electrode and of said part of said silicon film, respectively, an upper surface and said side surfaces of said part of said silicon film being entirely covered with said parts of said first and second insulating films, an upper surface of said gate electrode being exposed by said anisotropic etching, and said side surfaces of said gate electrode being covered with said parts of said second insulating film;

(h) introducing second impurities of said first conductivity type into said first and second surface portions of said silicon substrate to form source and drain regions of said MISFET in said first surface portion at both sides of said gate electrode and a base contact region of said bipolar transistor in said base region at both sides of said part of said silicon film respectively;

(i) introducing said first impurities into said base region from said part of said silicon film by heat treatment so as to form an emitter region of said bipolar transistor in said base region;

(j) after the steps (g) and (h), forming a refractory metal film on a whole surface of the resulting substrate including a surface of said source and drain regions, an exposed upper surface of said gate electrode and a surface of said base contact region; and (k) after step (j), heat treating the resulting substrate to selectively form silicide layers on said surface of said source and drain regions, said exposed upper surface of said gate electrode and said surface of said base contact region.

14. A method according to claim 13, wherein the silicide layers are selectively formed by reacting portions of the refractory metal film with silicon, parts of the refractory metal film being non-reacted, and further comprising the step of removing non-reacted parts of said refractory metal film by wet-etching, thereby leaving said silicide layers on said surface of said source and drain regions, said exposed upper surface of said gate electrode and said surface of said base contact region, respectively.

15. A method according to claim 13, wherein said refractory metal film is formed so as not to be in direct contact with said part of said silicon film.

* * * * *